US010312312B2

(12) United States Patent
Kim et al.

(10) Patent No.: US 10,312,312 B2
(45) Date of Patent: Jun. 4, 2019

(54) DISPLAY DEVICE HAVING LTPS AND OXIDE TFTS INTEGRATED ON THE SAME SUBSTRATE

(71) Applicant: LG Display Co., Ltd., Seoul (KR)

(72) Inventors: Eui Tae Kim, Gyeonggi-do (KR); Bu Yeol Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 152 days.

(21) Appl. No.: 15/520,153

(22) PCT Filed: Dec. 31, 2015

(86) PCT No.: PCT/KR2015/014563
§ 371 (c)(1),
(2) Date: Apr. 19, 2017

(87) PCT Pub. No.: WO2016/108664
PCT Pub. Date: Jul. 7, 2016

(65) Prior Publication Data
US 2017/0329189 A1    Nov. 16, 2017

(30) Foreign Application Priority Data

Dec. 31, 2014 (KR) .................. 10-2014-0196000

(51) Int. Cl.
*G02F 1/1362* (2006.01)
*H01L 51/05* (2006.01)
(Continued)

(52) U.S. Cl.
CPC ........ *H01L 27/3262* (2013.01); *G02F 1/1368* (2013.01); *G02F 1/13454* (2013.01);
(Continued)

(58) Field of Classification Search
CPC ............. G09G 2300/0876; G09G 2300/0452; G09G 2300/0417; G09G 2300/0861;
(Continued)

(56) References Cited

U.S. PATENT DOCUMENTS

| 9,123,816 B2 | 9/2015 | Kim et al. |
| 2002/0042167 A1* | 4/2002 | Chae ................. G02F 1/136286 438/149 |

(Continued)

FOREIGN PATENT DOCUMENTS

| KR | 10-2010-0086256 A | 7/2010 |
| KR | 10-2014-0117041 A | 10/2014 |
| KR | 10-2014-0120736 A | 10/2014 |

OTHER PUBLICATIONS

International Search Report dated Apr. 11, 2016 for corresponding International Application No. PCT/KR2015/014563.
(Continued)

*Primary Examiner* — Darlene M Ritchie
(74) *Attorney, Agent, or Firm* — Morgan, Lewis & Bockius LLP

(57) ABSTRACT

Provided is a display device. A poly-Si layer is disposed on a substrate. A first metal layer is disposed on the poly-Si layer, and a metal oxide layer is disposed on the first metal layer. A second metal layer is disposed on the metal oxide layer. The first metal layer is overlapped with the second metal layer. The first metal layer and the second metal layer may be gate lines connected to different TFTs.

14 Claims, 16 Drawing Sheets

(51) Int. Cl.
*H01L 27/146* (2006.01)
*G02F 1/1345* (2006.01)
*G02F 1/1368* (2006.01)
*G02F 1/163* (2006.01)
*G09G 3/3233* (2016.01)
*G09G 3/20* (2006.01)
*H01L 27/12* (2006.01)
*H01L 27/32* (2006.01)

(52) U.S. Cl.
CPC .... *G02F 1/136277* (2013.01); *H01L 27/1251* (2013.01); *H01L 27/14692* (2013.01); *H01L 51/0554* (2013.01); *G02F 1/136286* (2013.01); *G02F 2001/1635* (2013.01); *G09G 3/2048* (2013.01); *G09G 3/3233* (2013.01); *G09G 2300/0417* (2013.01); *G09G 2300/0452* (2013.01); *G09G 2300/0861* (2013.01); *G09G 2300/0876* (2013.01); *G09G 2310/0216* (2013.01); *G09G 2310/0262* (2013.01); *G09G 2340/0435* (2013.01); *H01L 27/1222* (2013.01); *H01L 27/3265* (2013.01)

(58) Field of Classification Search
CPC ........... G09G 2300/02; G09G 2300/04; G09G 2310/0216; G09G 2310/0262; G09G 2340/0435; G09G 3/3233; G09G 3/2048; G09G 3/32; G06F 3/0412; H01L 27/14692; H01L 27/1251; H01L 27/28; H01L 27/124; H01L 27/1225; H01L 27/1222; H01L 27/1214; H01L 27/127; H01L 51/0554; G02F 1/13454; G02F 1/1368; G02F 1/136286; G02F 1/136277; G02F 2001/1635
See application file for complete search history.

(56) References Cited

U.S. PATENT DOCUMENTS

| | | | |
|---|---|---|---|
| 2009/0002590 A1* | 1/2009 | Kimura | H01L 27/1214 349/43 |
| 2009/0142888 A1* | 6/2009 | Tsuchiya | H01L 21/8221 438/151 |
| 2010/0176395 A1 | 7/2010 | Choi et al. | |
| 2010/0182223 A1 | 7/2010 | Choi et al. | |
| 2011/0049523 A1* | 3/2011 | Choi | H01L 27/1225 257/72 |
| 2012/0043894 A1* | 2/2012 | Koh | H01L 27/3269 315/151 |
| 2013/0015448 A1* | 1/2013 | Yang | H01L 27/0688 257/59 |
| 2013/0092927 A1* | 4/2013 | Murai | H01L 27/1222 257/43 |
| 2013/0214279 A1* | 8/2013 | Nishimura | G02F 1/13338 257/59 |
| 2014/0131703 A1* | 5/2014 | Miyamoto | H01L 27/1225 257/43 |
| 2014/0159038 A1 | 6/2014 | Im | |
| 2014/0291636 A1 | 10/2014 | Kim et al. | |
| 2014/0299842 A1 | 10/2014 | Kim et al. | |
| 2015/0054799 A1* | 2/2015 | Chang | H01L 27/3262 345/204 |
| 2015/0055051 A1* | 2/2015 | Osawa | H01L 27/1225 349/48 |
| 2015/0144892 A1* | 5/2015 | Chang | H01L 27/3265 257/40 |
| 2016/0064444 A1* | 3/2016 | Inoue | H01L 29/7869 257/43 |

OTHER PUBLICATIONS

Office Action dated May 2, 2016 for corresponding Korean Patent Application No. 10-2014-0196000.
Office Action dated Jul. 12, 2016 for corresponding Korean Patent Application No. 10-2014-0196000.
Notice of Allowance dated Aug. 26, 2016 for corresponding Korean Patent Application No. 10-2014-0196000.
First Examination Report dated Feb. 20, 2019, issued in corresponding Indian Patent Application No. 201617045017.

* cited by examiner

DISPLAY DEVICE HAVING LTPS AND OXIDE TFTS INTEGRATED ON THE SAME SUBSTRATE

TECHNICAL FIELD

The present disclosure relates to a display device, and more particularly, to a display device in which a size of a circuit part is reduced and a higher capacitance can be achieved from the same size.

DESCRIPTION OF THE RELATED ART

Flat panel displays (FPDs) are employed in various electronic devices such as mobile phones, tablets, notebook computers as well as televisions and monitors. Examples of the FPD include a liquid crystal display (LCD), a plasma display panel (PDP), an organic light emitting diode (OLED) display as well as an electrophoretic display (EPD).

Generally, pixels in a FPD are disposed in a matrix form, and generate light (luminescence) upon electrical activation from an array of thin-film-transistors (TFTs), also known as TFT backplane. A TFT backplane is an important part of a FPD as it functions as a series of switches to control the current flowing to each individual pixel. Until recently, there have been two primary types of TFT backplane technologies, one using TFTs with an amorphous silicon (a-Si) active layer and the other using TFTs with a polycrystalline silicon (poly-Si) active layer.

A TFT with a-Si active layer generally has lower carrier mobility (m) than that of a TFT with poly-Si active layer. Thus, making a high-speed driving circuit (for example, pixel circuit, gate driving integrated circuit, data driving integrated circuit) for a display is difficult with the TFT backplane employing a-Si TFTs.

A layer of amorphous silicon can be subjected to a heat-treatment using a laser beam to form polycrystalline silicon active layer. The material from this process is generally referred to as low-temperature polycrystalline silicon (LTPS). In general, the carrier mobility (m) of LTPS TFTs is higher than the a-Si TFTs by as much as 100 times (>100 $cm^2/Vs$). Despite the higher carrier mobility (m), LTPS TFTs tend to have variations in their threshold voltages Vth due to the existence of grain boundaries. Such non-uniform threshold voltages among the TFTs employed in a TFT backplane result in non-uniformity in display, referred to as the "mura." For this reason, a display driving circuit implemented with LTPS TFTs often requires a complex compensation circuit, which in turn, increases the manufacturing time and cost of the display.

For flexible displays, a-Si TFTs or LTPS TFTs must be formed at temperatures sufficiently low to suppress degradation of thin plastic or glass substrates. However, lowering the temperature during the fabrication process degrades the performance of the TFTs, limiting their use for flexible displays.

Such disadvantages of the silicon based TFTs called for yet another type of backplane technology, which employs TFTs (oxide TFTs) having their active layer including a metal oxide material. In particular, oxide TFTs offer an attractive alternative to silicon based TFTs because of their high mobility (>10 $cm^2/V·s$) and low process temperature (<250° C.), compared to those of a-Si TFTs. The lower leakage current and the scalability to any glass size make the oxide TFT a promising candidate for making a high performance TFT backplane for displays at low cost.

Stable and high-yield production of a TFT backplane employing oxide TFTs requires optimization of the TFT design, dielectric and passivation materials, uniformity in oxide film deposition, annealing conditions, and more. Also, variations in manufacturing process make it difficult to tightly control operations of such TFTs, including their threshold voltages. For example, adopting the etch-stopper type oxide TFTs can improve reliability, but such a design suffers from high parasitic capacitance and complicates the manufacturing process. Further, the etch-stopper type limits how short the TFT channel can be, thereby affecting the aperture ratio in the pixels of the display or the overall size of the display backplane. As such, the task of designing the driving circuitry for a display becomes complex in view of such constraints.

SUMMARY

In view of the problems above, inventors of the present disclosure recognized that there is a limit in a conventional display device employing only one kind TFTs as its constituent TFTs. Ever expanding applications of FPDs in devices requiring versatile pixel driving methods adds to the needs for providing a display device that combines advantages of a plurality of types of TFTs such as oxide TFTs and LTPS TFTs. In particular, a display with higher resolution and lower power consumption can be provided by a display device that employs a plurality of types of TFTs on a substrate.

Accordingly, an object to be achieved by the present disclosure is to provide a display device in which both of an oxide TFT and an LTPS TFT are applied to a driving circuit in a pixel or a non-display area.

Further, another object to be achieved by the present disclosure is to provide a display device in which a size of a circuit part is reduced by overlapping a gate line connected to an oxide TFT with a gate line connected to an LTPS TFT.

Furthermore, yet another object to be achieved by the present disclosure is to provide a display device having a capacitor with an increased capacitance by using a plurality of capacitors connected in parallel to each other without increasing a size of the capacitor.

The objects of the present disclosure are not limited to the aforementioned objects, and other objects, which are not mentioned above, will be apparent to a person having ordinary skill in the art from the following description.

According to an aspect of the present disclosure, there is provided a display device. A polycrystalline silicon (poly-Si) layer is on a substrate. A first metal layer is on the poly-Si layer, and a metal oxide layer is on the first metal layer. A second metal layer is disposed on the metal oxide layer. The first metal layer is overlapped with the second metal layer. The first metal layer and the second metal layer may be gate lines connected to different TFTs. Thus, in the display device, a plurality of gate lines may be disposed so as to be overlapped with each other. Therefore, an area occupied by a circuit part in the display device can be reduced. Accordingly, it is possible to manufacture a display device with higher resolution, a transparent display device with improved transmittance, and a display device with a reduced size of a non-display area.

The display device may further include a plurality of switching thin-film-transistors (TFTs) and a driving TFT disposed in a pixel defined on the substrate. The first metal layer and the second metal layer are respectively connected to gate electrodes of different switching TFTs among the plurality of switching TFTs.

The first metal layer and the second metal layer may be extended in the same direction.

The first metal layer and the second metal layer may be gate lines.

The poly-Si layer may be an active layer of a switching TFT connected to the first metal layer. Further, the metal oxide layer may be an active layer of a switching TFT connected to the second metal layer.

One terminal of a switching TFT connected to the second metal layer may be connected to a gate electrode of the driving TFT.

The display device may further include a driving circuit disposed in a non-display area of the substrate and implemented with a plurality of TFTs. The first metal layer and the second metal layer may be respectively connected to gate electrodes of different TFTs among the plurality of TFTs.

The driving circuit may be a gate driver for providing one or more gate signals to a pixel defined on the substrate.

The poly-Si layer may include conductivized polycrystalline silicon, the metal oxide layer may include conductivized metal oxide, and the poly-Si layer, the first metal layer, the metal oxide layer and the second metal layer may be overlapped with each other.

The display device may further include a capacitor in which a first sub-capacitor, a second sub-capacitor and a third sub-capacitor are connected in parallel to each other. Two terminals of the first sub-capacitor may be the poly-Si layer and the first metal layer, two terminals of the second sub-capacitor may be the first metal layer and the metal oxide layer, and two terminals of the third sub-capacitor may be the metal oxide layer and the second metal layer.

The display device may further include a first switching TFT disposed in a pixel defined on the substrate and having one terminal connected to a first node, a driving TFT having a gate electrode connected to the first node and one terminal connected to a second node, a second switching TFT having one terminal connected to the second node, and an organic light emitting diode connected to the second node. The capacitor may be connected between the first node and the second node.

The first metal layer may include the same material as a gate electrode of the second switching TFT, and the second metal layer may include the same material as a gate electrode of the first switching TFT.

The first switching TFT may be an oxide TFT, and the second switching TFT and the driving TFT may be low-temperature polycrystalline silicon (LTPS) TFTs.

The first metal layer and the second metal layer may be connected to the first node, and the poly-Si layer and the metal oxide layer may be connected to the second node.

The display device may further include a driving circuit disposed on a non-display area of the substrate and including the capacitor.

The driving circuit may be a gate driver for providing one or more gate signals to a pixel defined on the substrate.

Details of other embodiments will be included in the detailed description of the disclosure and the accompanying drawings.

According to the present disclosure, a gate line connected to an oxide TFT disposed in a driving circuit in a pixel or a non-display area is separated from a gate line connected to an LTPS TFT. Therefore, it is possible to optimize the performance of each of the oxide TFT and the LTPS TFT.

Further, according to the present disclosure, the gate line connected to the oxide TFT is overlapped with the gate line connected to the LTPS TFT, thereby reducing an area occupied by the circuit. Accordingly, it is possible to provide a display device with higher resolution, a transparent display device with improved transmittance, and a display device with a reduced size of a non-display area.

Furthermore, according to the present disclosure, a plurality of sub-capacitors is connected in parallel to each other in the same area, thereby increasing a capacitance of a capacitor. Further, it is possible to more easily manufacture a display device with higher resolution or a display device with higher transmittance.

The effects of the present disclosure are not limited to the aforementioned effects, and other various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
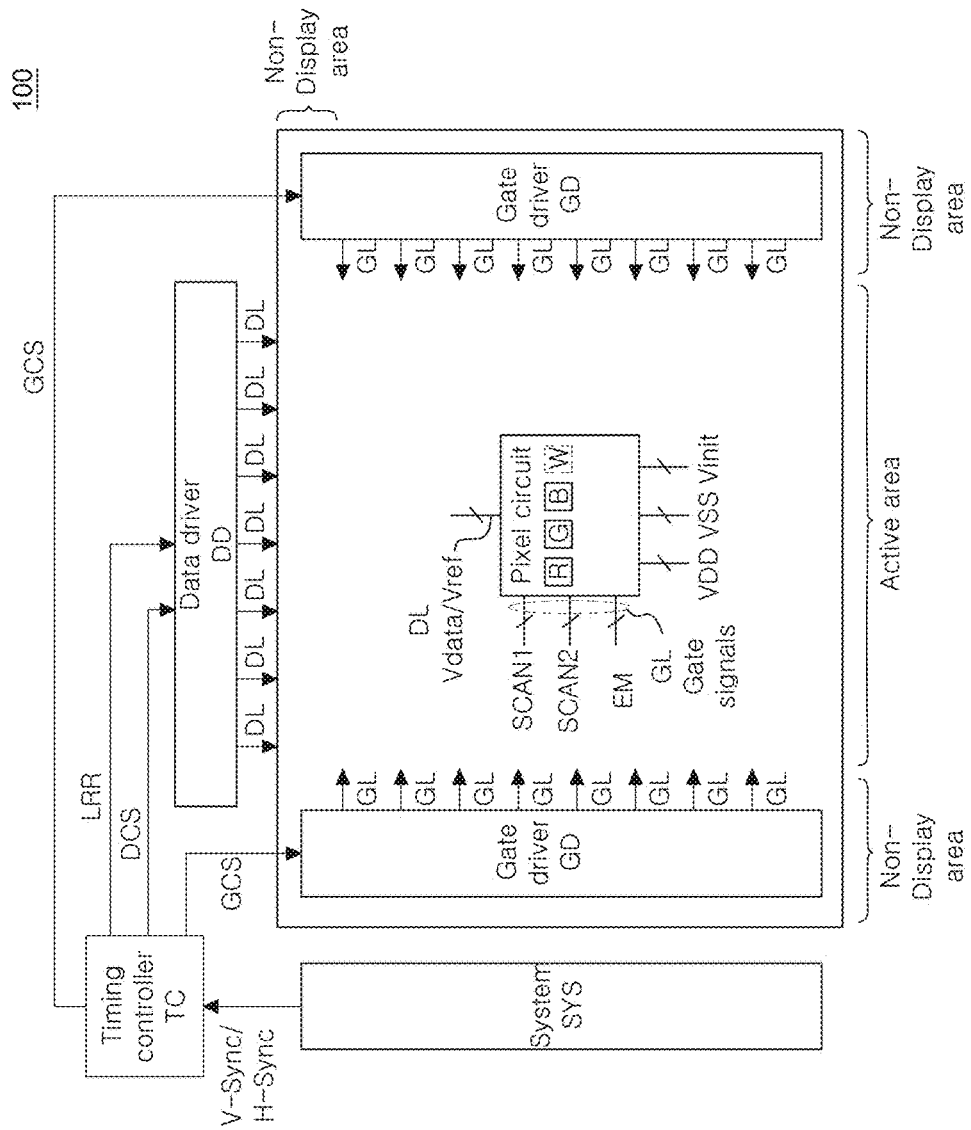
FIG. 1 is a schematic diagram illustrating a display device having an active area and a non-display area according to an embodiment of the present disclosure.

Advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various embodiments of the present disclosure will be described in detail with reference to the accompanying drawings.

Exemplary Display

While a conventional configuration of pixel circuits and driving methods may solve for some of the drawbacks, it may not satisfy the continuously increasing requirements of the modern display.

A polycrystalline silicon active layer of an LTPS TFT offers greater carrier mobility than that of an oxide TFT. The higher carrier mobility means that the TFT can be fabricated smaller for the same performance. Fabrication process of LTPS TFT is well suited for a co-planar structured TFT, which provides lower capacitance than the etch-stop structure typically used in an oxide TFT. However, a display device made entirely of LTPS TFT suffers from an increased power consumption due to the high off current of the LTPS TFT and may also have issues in display quality due to the variation in initial threshold voltage among the TFTs of the display device. On the other hand, the oxide TFT offers scalability over a large sized display device with more reliable initial threshold voltage than that of the LTPS TFT. Not only does oxide TFT have lower off current that makes more power efficient display device in a normal operation of the display device, if necessary, it varies a refresh rate to drive the circuits with even greater power savings of the display device. A simpler and lower cost fabrication process coupled with the scalability for larger area over a display device makes the oxide TFT a better choice than the LTPS TFT for part of a display device.

In the present disclosure, the active layer of the oxide TFT in the present disclosure may be made from various metal oxides. Examples of a constituent material of the active layer include a quaternary metal oxide such as an indium-tin-gallium-zinc-oxide (In—Sn—Ga—Zn—O)-based material, a ternary metal oxide such as an indium-gallium-zinc-oxide (In—Ga—Zn—O)-based material, an indium-tin-zinc-oxide (In—Sn—Zn—O)-based material, an indium-aluminum-zinc-oxide (In—Al—Zn—O)-based material, an indium-hafnium-zinc-oxide (In—Hf—Zn—O)-based material, a tin-gallium-zinc-oxide (Sn—Ga—Zn—O)-based material, an aluminum-gallium-zinc-oxide (Al—Ga—Zn—O-based material) and a tin-aluminum-zinc-oxide (Sn—Al—Zn—O)-based material, and a binary metal oxide such as an indium-zinc-oxide (In—Zn—O)-based material, a tin-aluminum-zinc-oxide (Sn—Zn—O)-based material, an aluminum-zinc-oxide (Al—Zn—O)-based material, a zinc-magnesium-oxide (Zn—Mg—O)-based material, a tin-magnesium-oxide (Sn—Mg—O)-based material, an indium-magnesium-oxide (In—Mg—O)-based material, an indium-gallium-oxide (In—Ga—O)-based material, an indium-oxide (In—O)-based material, a tin-oxide (Sn—O)-based material and a zinc-oxide (Zn—O)-based material. Composition ratios of the elements included in the respective oxide semiconductor materials are not particularly limited, and may be adjusted at various composition ratios.

In various embodiments of the present disclosure, however, display devices are implemented with at least two different types of TFTs. That is, at least two different types of TFTs are formed on a single substrate to implement circuitry for operating a display device. For example, one or more of driving circuits in the non-display area of the substrate can be implemented with a first type of TFTs (for example, LTPS TFTs) while the pixel circuit in the active area (i.e., display area) of the substrate is implemented with another type of TFTs (for example, oxide TFT). Also, the pixel circuit in the active area and/or any other circuit fabricated in the non-display area of the substrate may be implemented with at least two different types of TFTs. For example, at least one TFT (for example, driving TFT) included in a pixel circuit can be the first type of TFT (for example, LTPS TFT). Further, at least one other TFT (for example, switching TFT) included in the pixel circuit consists of the second type of TFT (for example, oxide TFT). It should be appreciated that a driving circuit fabricated in the non-display area of the substrate may also include at least two different types of TFTs. The type of TFTs employed in the part of the circuit and the part of the pixel circuit in the non-display area can vary according to the requirements of the display device 100.

Exemplary Display Device

FIG. 1 is a schematic diagram illustrating a display device having an active area and a non-display area according to an embodiment of the present disclosure. The display device 100 may be implemented with a self-emitting organic light-emitting diode (OLED) or a liquid crystal (LC) material. The display device 100 is described as an OLED display including an organic light emitting diode in the embodiments of the present specification. However, it should be appreciated that the embodiments of the present disclosure are also applicable to an LCD device.

The display device 100 can be defined in an active area (i.e., display area) and a non-active area (i.e., non-display area). In the display area, a plurality of pixels is disposed in a matrix. Each of the pixels is associated with a pixel circuit implemented with one or more TFTs and capacitors that are configured to receive various signals from the driving circuits. The TFTs for implementing the pixel circuits may be formed on the substrate 110, which may be referred to a TFT substrate or a TFT backplane. For example, the substrate 110 may be a glass substrate, a plastic substrate, or other suitable substrate.

In operating the display device 100, various circuits and components may operate together to provide signals and/or voltages to the pixel circuits in the active area. Non-limiting examples of the circuits and components that may be needed in operating the display device 100 include a system (SYS), a timing controller (TC), a data driver (DD), a gate driver (GD), and the like. Circuits and components necessary in operating the display device may vary depending on the type of the display device 100 (for example, OLED, LCD, and the like).

Some of these components may be integrated into a package. For instance, the timing controller TC and the data driver DD may be integrated into a single package, which may be collectively referred to as a display driver integrated circuit (display D-IC). The display D-IC may be mounted in the non-display area of the substrate 110 using the chip-on-glass (COG) technology, via tape-carrier-package (TCP) or Chip-on-Film (COF) technology.

The display D-IC may include various other circuits serving different functionalities in operating the display device 100. For example, the display D-IC may include storage circuits such as volatile and non-volatile memory circuits, solid state drives (SSD), hard drives, and other memories. The display D-IC may also include a processor such as processing circuitry in a microprocessor or other processor. Examples of integrated circuits that may be included in display driver-IC include microprocessors, digital signal processors, power management units, baseband processors, microcontrollers, application-specific integrated circuits, circuits for handling audio and/or visual information, and other control circuitry.

Some driving circuits may be formed on a separate substrate and connected to the substrate 110 to transmit signals to the pixels. In the embodiments of the present disclosure, at least one of the various driving circuits for providing a signal and/or voltage to the pixel circuits is implemented with one or more TFTs formed in the non-active area (i.e., non-display area) of the substrate 110. By way of example, one or more gate drivers GD can be formed in the non-display area of the substrate 110 using the gate-in-panel (GIP) technology as illustrated in FIG. 1. However, it should be noted that the number of gate drivers GD on the substrate 110 is not particularly limited. For instance, one gate driver GD or more than two gate drivers GD may be formed in the non-display area of the substrate 110.

The data driver DD can be integrated in the display D-IC by using COG, TCP or COF. However, in some embodiments, the data driver DD or at least part of the data driver DD can be implemented with TFTs fabricated in the non-display area of the substrate 110 in the similar fashion (i.e., GIP technology) as the gate driver GD. For instance, the data driver DD may include one or more of source drive ICs, buffers and multiplexers, which may be implemented directly on the substrate 110.

As such, it should be appreciated that circuits, which can be fabricated with TFTs in the non-display area of the TFT substrate 110, are not particularly limited. Any circuits for operating the display device 100 can be fabricated in the non-display area of the substrate 110 so long as they can be implemented by with TFTs on the substrate 110. Depending on the type of the display device 100 and its driving method, additional circuits, such as an emission driver ED, inverter, multiplexer, de-multiplexer and the like, may be used in operating the display device 100. Further, these circuits may be implemented with the TFTs fabricated in the non-display area of the substrate 110.

System

The system SYS may be configured to provide a vertical synchronization signal V-Sync, a horizontal synchronization signal H-Sync, a clock signal, and image data through a transmitter of a graphic controller to appropriate circuits. For instance, the clock signal and vertical/horizontal synchronization signal V-Sync/H-Sync from the system SYS are provided to the timing controller TC. Further, the image data from the system SYS is also provided to the timing controller TC.

Timing Controller

The timing controller TC receives the horizontal synchronization signal H-Sync, the vertical synchronization signal V-Sync, a data enable signal, a clock signal, and image data. The vertical synchronization signal V-Sync indicates time required to display an image of one frame. The horizontal synchronization signal H-Sync indicates time required to display one horizontal line of an image, i.e., one pixel line. Thus, the horizontal synchronization signal H-Sync includes pulses equal in number to the number of pixels included in one pixel line. The data enable signal indicates a period in which valid image data are positioned.

The timing controller provides a gate control signal GCS to the gate driver GD and a data control signal DCS to the data driver DD.

The gate control signal GCS applied to the gate driver GD may include a gate start pulse signal GSP, a gate shift clock signal GSC, a gate output enable signal GOE, and so on. The gate start pulse signal GSP is a signal for controlling the timing of a first gate signal of the gate driver GD. The gate shift clock signal GSC is a signal for sequentially shifting and outputting the gate start pulse signal GSP. The gate output enable signal GOE is a signal for controlling the output timing of the gate driver GD.

The timing controller TC redisposes image data such that image data having a predetermined bit, which is provided from an interface, may be provided to the data driver DD. For example, the timing controller TC may supply data driver DD with digital data corresponding to text, graphics, video, or other images to be displayed on display device 100. The data driver DD may convert the data received from the timing controller TC into signals for controlling the pixels.

A data control signal DCS provided to the data driver DD may include a source sampling clock signal SSC, a source output enable signal SOE, a source start pulse signal SSP, and so on. The source sampling clock signal SSC is used as a sampling clock for latching image data by the data driver DD and to determine a driving frequency of the data driver DD. The source output enable signal SOE is used to transmit the image data latched by the source sampling clock signal SSC to appropriate pixels. The source start pulse signal SSP is a signal indicating beginning of latch or sampling of the image data for one horizontal period. When the display device 100 is an LCD device, the data control signal DCS may also include a polarity reverse signal for reversing the polarity of the data voltage Vdata from the data driver DD.

In addition, the timing controller TC may be used in running various software for operating the display device 100. For example, the timing controller may be configured to execute code in connection with the displaying of images (for example, text, pictures, video, and the like) on display device 100. Otherwise, the timing controller TC may be configured to run testing software (for example, code that is used during manufacturing to support interactions between display device 100 and test equipment). Alternately, the timing controller TC may be configured to run code that allows the timing controller TC to adjust operating settings (for example, to store calibration data or other settings in a storage in the control circuitry such as a non-volatile storage).

As will be described in greater detail below, the timing controller TC can also be configured to adjust the frame rate of at least some part of the display area 100. In this regard, the timing controller TC can provide a low refresh rate signal LRR to a switching circuit coupled to the data driver DD and/or gate driver GD. Thus, the frequency of signals (for example, scan signal, emission signal, data signal) provided to pixel circuits in the display area can be adjusted.

In some embodiments, the output of the low refresh rate signal LRR may be controlled by the system SYS. The system SYS may be configured to analyze the image data and control the state of the low refresh rate signal LRR to the appropriate driving circuits. In some cases, the image data provided to the system SYS may include various data that can be used by the system SYS in generating the low refresh rate signal LRR. Non-limiting examples of the information that may be provided to the system SYS include information indicative of the type of image data, information indicative of dimension and location of the image content to be applied with an adjusted frame rate, and information indicative of appropriate frame rate.

It should be appreciated that the output of the low refresh rate signal LRR from the timing controller TC can be triggered by various other ways. For instance, if the display device 100 provides a specific mode in which the image content can be displayed at a low frame rate (for example, mode for displaying time on a screen, mode for displaying a static user interface, and the like), the low refresh rate signal LRR can be set to high upon the display device entering into such a mode. Likewise, exiting from such a low frame rate mode can set the low refresh rate signal LRR back to low. Triggering of the low frame rate mode can be controlled by software implemented in the system SYS or the timing controller TC. Further, it can also be triggered by receiving a user command via a touch interface and/or a physical button.

Data Driver

As mentioned, the data driver DD receives digital image data from the timing controller TC. The data driver DD may be configured to convert the digital image data into gamma correction voltages to generate data voltages Vdata, in response to data control signal DCS from the timing controller TC. And then, the data driver DD may supply the data voltages Vdata to the data lines DL of the display device 100 in synchronization with the gate control signal GCS from the gate driver GD. As will be described in greater detail below, in some embodiments, the data driver DD may be configured to output data voltages Vdata in a limited frequency rate in response to the low refresh rate signal LRR from the timing controller TC.

Gate Driver

The gate driver GD controls on/off of TFTs in pixels in response to the gate control signal GCS input from the timing controller TC and allows data voltages Vdata applied from the data driver DD to be applied to the appropriate pixel circuit. To this end, the gate driver GD sequentially outputs gate signals (for example, scan signals, emission signals) and sequentially applies the gate signals to the gate lines GL. When the gate signals are provided on a gate line GL, the data voltages Vdata may be applied to the sub-pixels (R, G, and B or W, R, G and B) of pixel circuits connected with that particular gate line GL. As will be described in further detail below, in some embodiments, the gate driver DD may be configured to pause sending out gate signals on certain gate lines in response to receiving the low refresh rate signal LRR from the timing controller TC.

Pixels

The data lines DL and gate lines GL of the exemplary display device 100 may cross each other in the active area, and each of the pixel circuits may be formed at the crossing of a data line DL and a gate line GL. The pixels may include liquid crystal display (LCD) components, organic light-emitting diode (OLED) components, or other suitable display pixel structures. As such, the configuration of TFTs and capacitors implementing the pixel circuit may vary depending on the type of the component of the display device as well as the driving methods for activating the pixel.

Each of the pixels may include a red sub-pixel R for displaying red color, a green sub-pixel G for displaying green color, and a blue sub-pixel B for displaying blue color. It should be noted that the alignment of the sub-pixels in the active area is not particularly limited. Further, in some embodiments, at least some of the pixels in the display device 100 may employ a white pixel or white sub-pixel as illustrated in FIG. 1.

Assuming the display device 100 in FIG. 1 is an OLED device, each pixel of the display device 100 may include at least one switching TFT, a driving TFT, an organic light emitting diode, and at least one capacitor. Each pixel can be connected to the data line DL and the gate line GL through the switching TFTs. Thus, each pixel receives a data voltage Vdata from the data driver DD through the data line DL and a gate signal from the gate driver GD through the gate line GL. In some embodiments, the display device 100 may include an emission driver ED (which may be a part of the gate driver GD), which provides an emission signal EM to each of the pixels. Each pixel emits light according to the current flowing to the organic light emitting diode, which is controlled by the switching TFT and the driving TFT. The display device 100 can be implemented as a bottom emission structure, a top emission structure, or dual emission (i.e., top and bottom) structure.

Uniform driving of OLED pixels is not easy. The difficulty in uniform driving of the pixels in the display device 100 largely attributes to (1) current-dependent luminance of the OLED, (2) large TFT dimensions with high gate-to-drain capacitance Cgd and gate-to-source capacitance Cgs, and (3) threshold voltages Vth and mobility variations of the TFTs in the pixel circuit. Also, the size and the carrier mobility of a TFT are generally proportional, but the size of the pixel area limits the number of TFTs and their sizes. Accordingly, mobility of the TFTs can be limited by the space available for the driving circuits and/or pixel circuit on the substrate 110. Solving these problems can be extremely difficult with the display device 100 using only single type of TFTs.

LTPS TFT-Based Driving Circuits and Oxide TFT-Based Pixel Circuit

Figure 2:
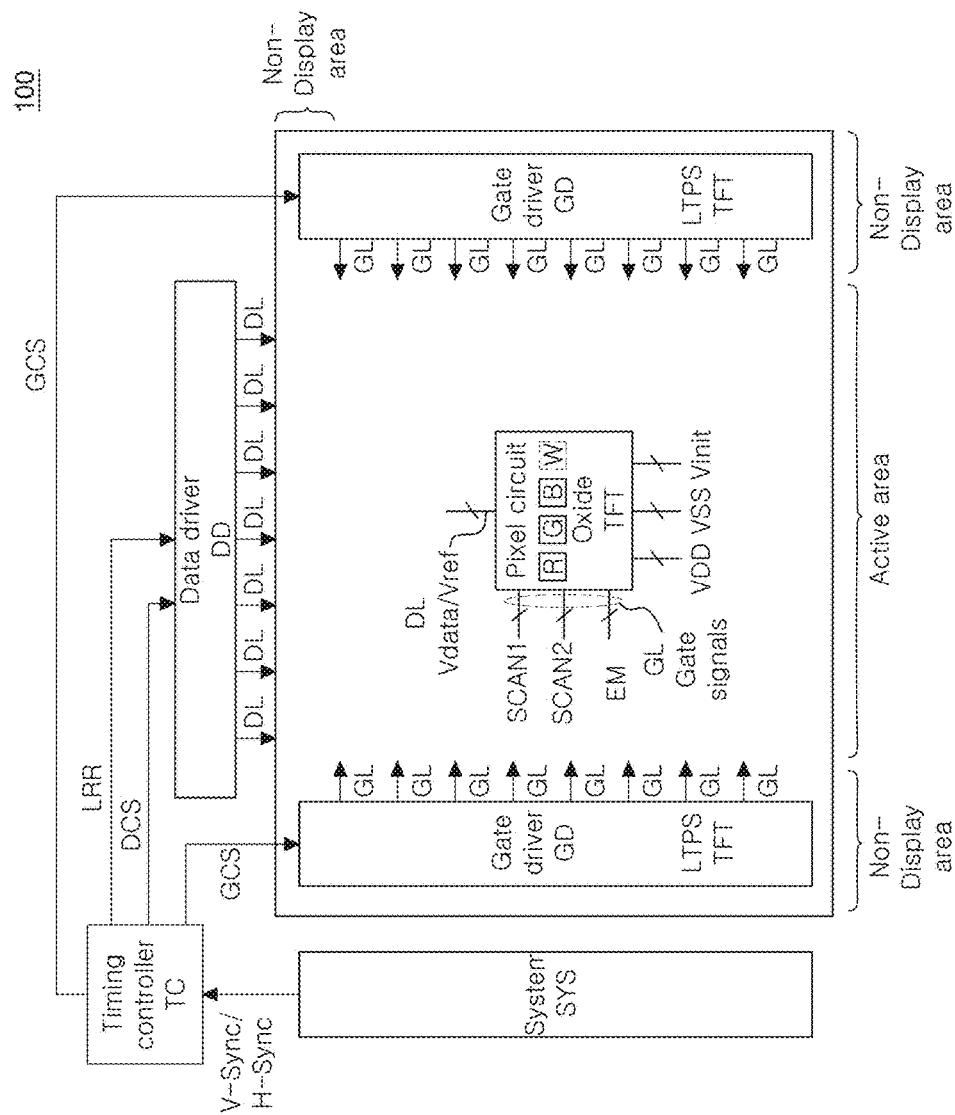
FIG. 2 is a schematic diagram illustrating an exemplary display device employing two different types of TFTs on the same substrate according to an embodiment of the present disclosure.

FIG. 2 is a schematic diagram illustrating an exemplary display device employing two different types of TFTs on the same substrate according to an embodiment of the present disclosure. In this example, the pixel circuits are implemented with oxide TFTs while the driving circuits formed in the non-display area (i.e., gate driver GD) are implemented with LTPS TFT. As mentioned, other driving circuits, such as buffers, (de)multiplexers, source driver, switching circuits, can be implemented with LTPS TFTs in the non-display area of the substrate 110.

Accordingly, the advantages of both oxide TFT and LTPS TFT are combined in the design of the display device 100. As discussed above, initial threshold voltage Vth and mobility variations of the LTPS TFT exist due to grain size and boundary variations. In contrast, the initial threshold voltage Vth of oxide TFTs can be substantially uniform within the substrate 110 as compared with LTPS TFTs. Accordingly, uniform threshold voltage Vth for the driving TFT and/or the switching TFT can be obtained by implementing the pixel circuits with oxide TFTs. As such, pixel circuits implemented with oxide TFTs would suffer significantly less from the pixel-to-pixel threshold voltage variation issue exhibited in the LTPS TFT-based oxide TFT, even in a large sized substrate 110.

With the gate driver GD implemented with LTPS TFTs, signals to the pixel circuits can be provided at a higher clock rate than the case in which the driving circuits are implemented with oxide TFTs. The area of the substrate 110 reserved for the driving circuits may be small enough to obtain sufficiently uniform threshold voltages among the LTPS TFTs of the driving circuits.

Efficient use of the space within the substrate 110 is yet another advantage offered by the display device 100 using the oxide TFT implemented with pixel circuits and the LTPS TFT implemented with driving circuits. Although the size of an individual oxide TFT may be larger than the size of an LTPS TFT, uniform threshold voltage of the oxide TFTs in the active area eliminates the need for a complex compensation circuit, which is often required in LTPS TFT implemented with pixel circuits.

Elimination of such a compensation circuit can simplify the design of the pixel circuits and reduce the size of the pixels. In addition, the low current leakage of the oxide TFT reduces the size of the capacitor that needs to be formed in each of the pixels. The reduction of TFT counts and the size of the capacitor can reduce the overall size of the pixel circuit. This can be an important factor for modern display devices such as ultra-high definition display devices as it provides a higher-resolution display device within a limited space.

Reducing the complexity and the size of the capacitors increases the size of a light transmissive area within a pixel, which can be crucial for a transparent display device. Since the reduction of the TFT counts and the size of the capacitor means less external light reflecting parts are present within a pixel, improvement in display quality is also expected from this display device design.

A non-display area of a Substrate 110 is often hidden under a masking (for example, bezel) around the display device 100. It may be desirable to minimize the non-display area of the substrate 110. The size of the non-display area may be minimized by minimizing circuit complexity in the gate driver GD or reducing the TFT counts in the gate driver GD. As mentioned above, the mobility (m) of LTPS TFTs is higher than that of oxide TFTs by several folds. As such, an LTPS TFT outperforms an oxide TFT even when it is fabricated several folds smaller than the oxide TFT. As a consequence, relatively smaller size of a LTPS TFT is used to constitute a driving circuit, thereby reducing a size of the non-display area on the substrate 110 to be covered by a bezel. Therefore, it is advantageous in implementing a narrow-bezel display device 100. In addition, LTPS TFT's on-resistance may be lower, yielding more power-efficient operation than the case in which the entire display device 100 consists of oxide TFTs.

In fabricating an LTPS TFT, hydrogenation of the poly-Si semiconductor layer may be performed. However, an oxide semiconductor layer, for example, an In—Ga—Zn-oxide semiconductor layer, may be negatively affected by hydrogen. The changes in TFT characteristics may lead to various problems. Nevertheless, in the design of the display device 100 of the present embodiment, the area of the substrate 110 with LTPS TFTs is separated from the area of the substrate 110 with oxide TFTs. Thus, the needs for a heavy barrier layer are eliminated and the fabrication of both types of TFTs can be simply fabricated on the same substrate 110.

LTPS TFT and Oxide TFT in a Pixel Circuit

In one embodiment, more elaborate optimization of the display device 100 is achieved by implementing a pixel circuit with a plurality of types of TFTs. That is, the type of individual TFT within a pixel circuit is carefully chosen based on its functionality, operating condition and various other requirements within the pixel circuit.

Figure 3A:
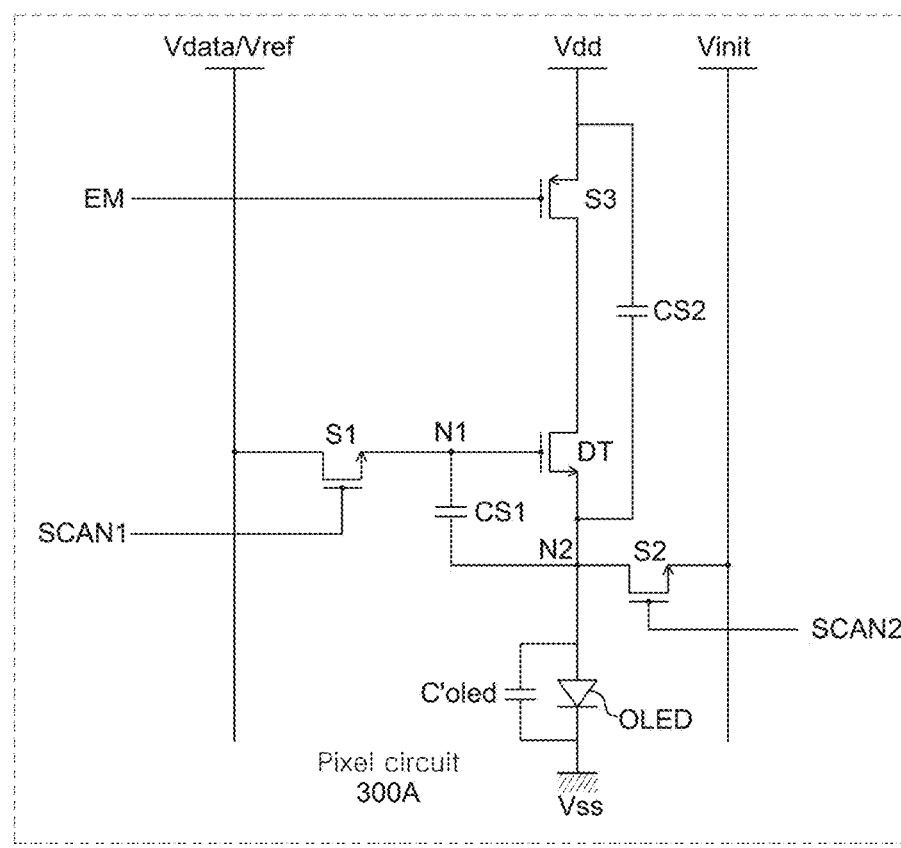
FIG. 3A through FIG. 3C are circuit diagrams of each pixel according to various embodiments of the present disclosure, respectively.
Figure 3B:
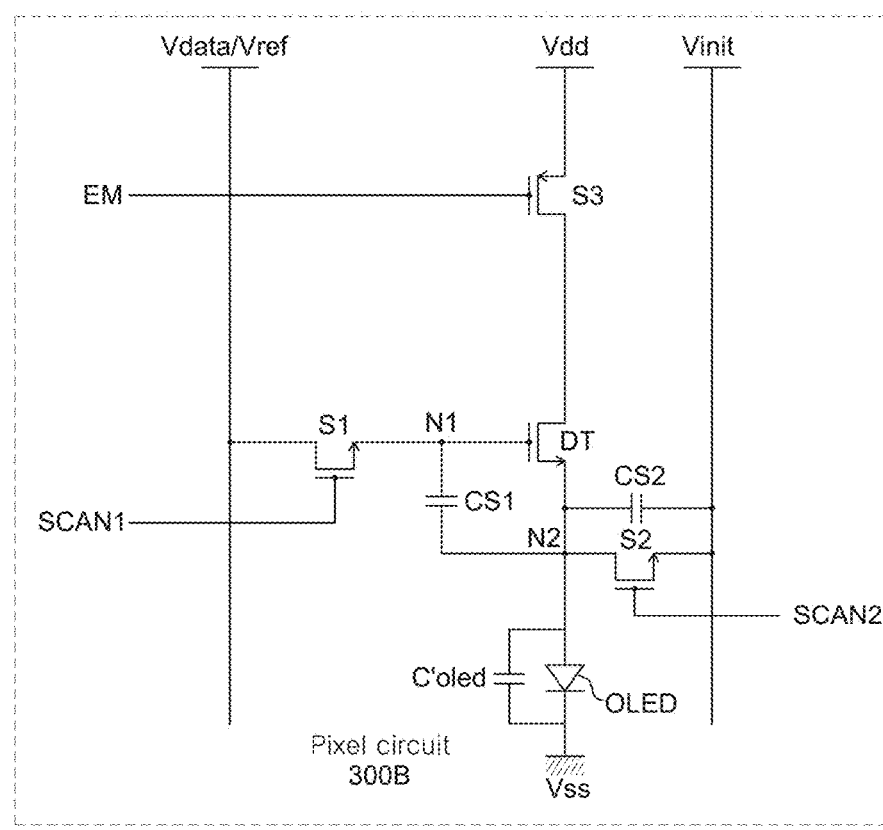
Figure 3C:
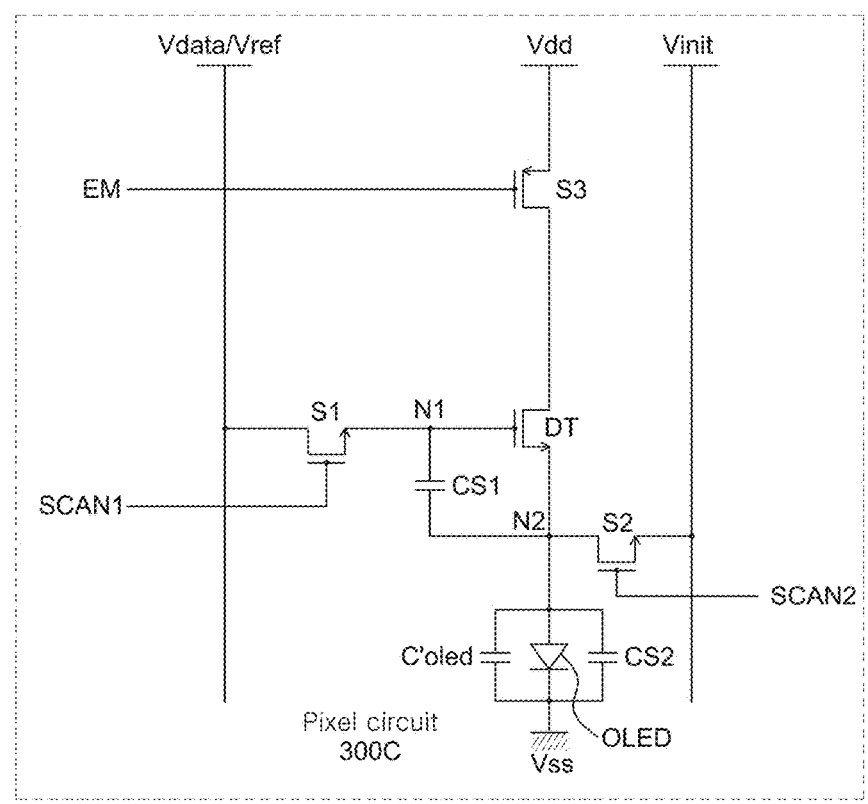
Figure 4A:
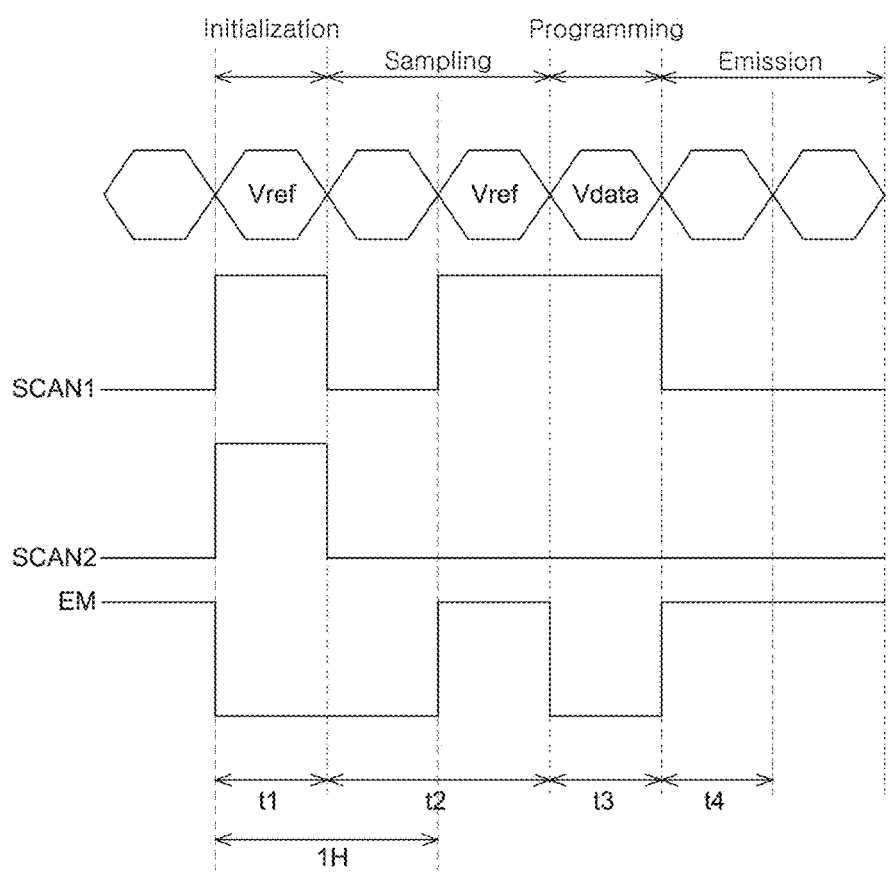
FIG. 4A is a timing diagram illustrating the operation of the pixel circuits of FIG. 3A through FIG. 3C.
Figure 4B:
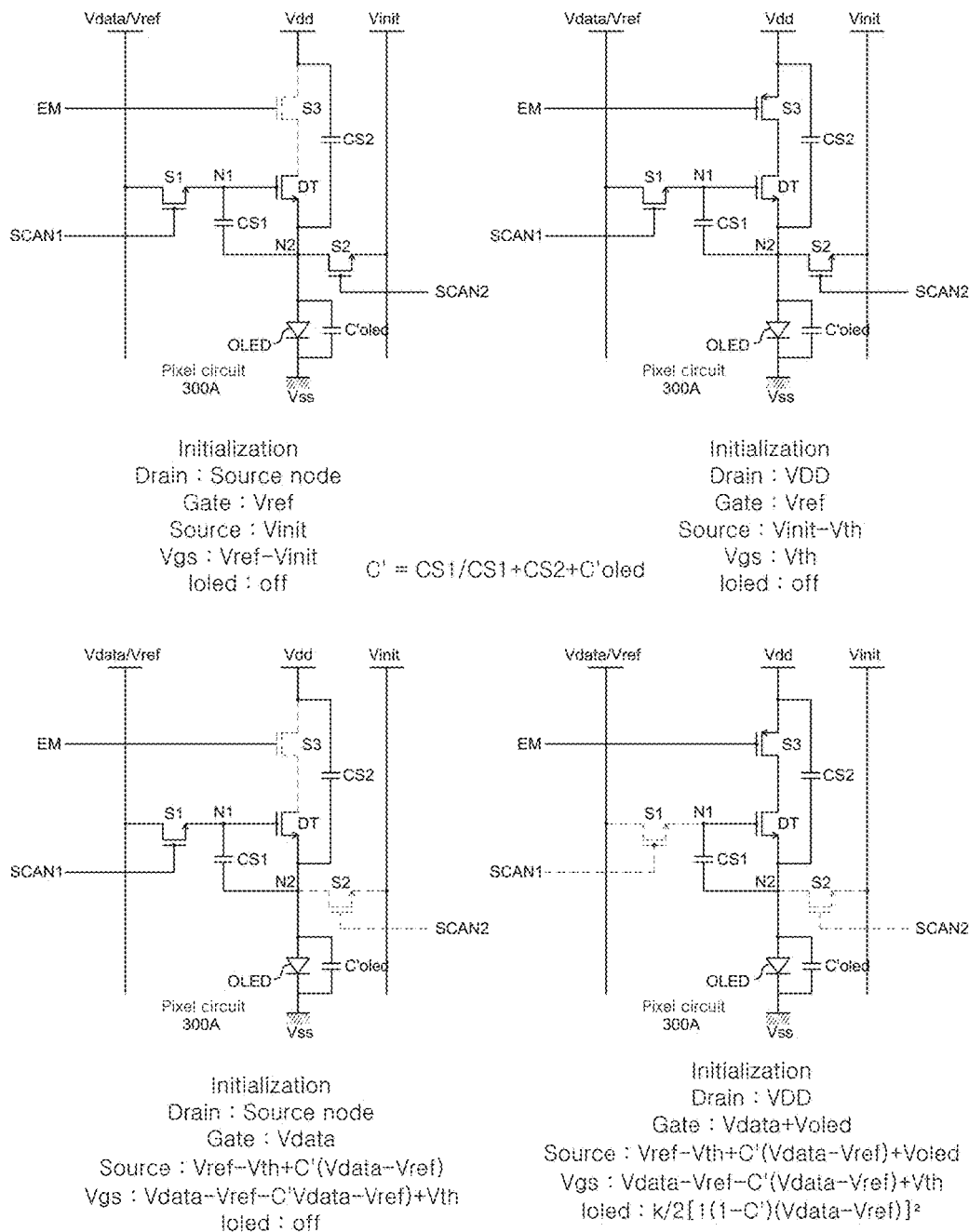
FIG. 4B is a detailed illustration explaining the operation of the pixel circuits of FIG. 3A through FIG. 3C.

FIG. 3A through FIG. 3C are circuit diagrams of each pixel according to various embodiments of the present disclosure, respectively. FIG. 4A is a timing diagram illustrating the operation of the pixel circuits of FIG. 3A through FIG. 3C. FIG. 4B is a detailed illustration explaining the operation of the pixel circuits of FIG. 3A through FIG. 3C. FIG. 3A through FIG. 3C illustrate a configuration of exemplary pixel circuits of a display device employing a plurality of types of TFTs. FIG. 4A and FIG. 4B illustrate an exemplary operation of the pixel circuits of FIG. 3A through FIG. 3C.

Firstly, referring to FIG. 3, each pixel of the display device 100 includes an OLED, and each pixel circuit 300A including a driving TFT DT, first to third switching TFTs S1-S3, and first and second capacitors CS1 and CS2. This alignment may be referred in the present disclosure as a 4T2C pixel circuit.

The exemplary pixel circuit 300A operates in a plurality of periods divided in accordance with a plurality of gate signals supplied to the pixel circuit 300A, namely, an initialization period t1, a sampling period t2, a programming period t3, and an emission period t4.

The first switching TFT S1 is turned on or off based on the state of the first scan signal SCAN1. Turning the first switching TFT S1 on connects the data line DL to the first node N1, which is connected to the gate electrode of the driving TFT DT. High level first scan signal SCAN1 is provided to the first switching TFT S1 during the initialization period t1 and the sampling period t2 to turn on the first switching TFT S1. During the initialization period t1 and the sampling period t2, the data line DL supplies the reference voltage Vref, which is provided to the first node N1 via the first switching TFT S1. The first switching TFT S1 is provided with high level first scan signal SCAN1 during the programming period t3 as well. During the programming period t3, the data line DL provides data voltage Vdata such that the switching TFT S1 supplies the data voltage Vdata to the first node N1.

The second switching TFT S2 is turned on or off based on the state of the second scan signal SCAN2. During the initialization period t1, the second switching TFT S2 is turned on such that the initialization voltage Vinit is provided to the second node N2, which is connected to a source electrode of the driving TFT DT.

The third switching TFT S3 is turned on or off based on state of the emission signal EM. The third switching TFT S3 may be configured to provide a high potential driving voltage Vdd from the Vdd supply line to a drain of the driving TFT DT during the sampling period t2 and the emission period t4.

The OLED has one terminal receiving a high potential driving voltage Vdd and another terminal receiving a low potential driving voltage Vss. The driving TFT DT is connected in series between the Vdd supply line and the Vss supply line, together with the OLED. The driving TFT DT controls an amount of current flowing in the OLED depending on a voltage difference between a source electrode and a gate electrode of the driving TFT DT. In the emission period t4, the driving TFT DT supplies drive current holed to the OLED.

In this exemplary pixel circuit, the first capacitor CS1 is connected between the first node N1 and the second node N2. The first capacitor CS1 stores the threshold voltage Vth of the driving TFT DT in the sampling period t2. The second capacitor CS2 is connected between the Vdd supply line and the second node N2. The second capacitor CS2 is connected to the first capacitor CS1 in series, thereby reducing the capacitance ratio of the first capacitor CS1. Reducing the capacitance ratio of the first capacitor CS1 within the pixel circuit allows more efficient use of the data voltage Vdata applied to the first node N1 during the programming period t3. The second capacitor CS2 enhances the luminance of the OLED with the same data voltage Vdata.

As illustrated in FIG. 3B, the second capacitor CS2 may be connected between the Vinit supply line and the second node N2. Alternatively, the second capacitor CS2 may be connected between the Vss supply line and the second node N2, as illustrated in FIG. 3C. The exemplary operation illustrated in FIG. 4A and FIG. 4B can be applied to all of the exemplary pixel circuits illustrated in FIG. 3A through FIG. 3C.

In an operation, the first and second switching TFTs S1 and S2 are turned on in the initialization period t1. Then, the reference voltage Vref is supplied to the first node N1 via the first switching TFT S1. The initial voltage Vinit is supplied to the second node N2. As a result, the pixel is initialized.

Subsequently, in the sampling period t2, the first and third switching TFTs T1 and T3 are turned on. The first node N1 sustains the reference voltage Vref. In the driving TFT DT, current flows toward the source electrode in a state in which its drain electrode of the driving TFT DT is floated by the high potential driving voltage Vdd. When the source voltage of the driving TFT DT is equal to "Vref−Vth", the driving TFT DT is turned off. Here, "Vth" represents the threshold voltage of the driving TFT DT.

In the programming period t3, the first switching TFT S1 is turned on, and the data voltage Vdata is supplied to the first node N1 via the first switching TFT S1. As a result, the voltage of the second node N2 is changed to "Vref−Vth+C' (Vdata−Vref)" due to a coupling phenomenon within the pixel circuit. This phenomenon results from the voltage distribution by the in-series connection of the first and second capacitors CS1 and CS2. Here, "C'" represents "CS1/(CS1+CS2+C'oled)". "C'oled" represents the capacitance of the OLED.

In the emission period t4, the third switching TFT S3 is turned on. As a result, the driving TFT DT supplies the drive current. In this configuration, the drive current supplied from the driving TFT DT to the OLED can be expressed by the following equation: $\frac{1}{2} \ast K(Vdata-Vref-C'(Vdata-Vref))^2$. Here, "K" represents a constant determined in accordance with a mobility of the driving TFT DT and a parasitic capacitance of the driving TFT DT.

As can be recognized from the equation above, the third switching TFT S3 employed in the exemplary pixel circuits of FIG. 3A, FIG. 3B and FIG. 3C suppresses the driving TFT DT to be turned on during the programming period t3 by the high potential driving voltage Vdd from the Vdd supply line. Further, the pixel circuit employs the capacitor CS1 and the capacitor CS2 to meet the capacitance size capable of providing the desired voltage holding ratio (for example, Voltage Holding Ratio>99%) for the pixel circuit. This configuration can reduce the current leakage from the first switching TFT S1, allowing to sustain the voltage at the gate electrode of the driving TFT DT. The stable voltage at the gate electrode of the driving TFT DT enables more efficient use of the data voltage Vdata during the programming period t3.

As such, the drive current of the OLED is not influenced by the threshold voltage Vth of the driving TFT DT and the high potential driving voltage Vdd. The configuration of the pixel circuit described above compensates the threshold voltage Vth differences between the driving TFTs in the pixels as well as the voltage drop of the high potential driving voltage Vdd. Thus, unwanted display non-uniformity can be reduced. Further, the mobility variation of the driving TFT DT can be compensated by adjusting the ascending time of the emission signal EM transitioning from a low state to a high state at a start point of the emission period t4.

While all of the TFTs on the substrate operate jointly to control the emission of light from the OLED, each of the TFTs serves a different function as described above. As such, TFTs implementing a pixel circuit have different operating conditions and requirements amongst each other even within a pixel circuit. Moreover, the display device 100 may have various requirements such as minimum visual quality (for example, luminance, and uniformity), power efficiency, higher pixel density, size of the non-display/active areas, and more.

Even with the addition of the third switching TFT S3 and the serially distributed capacitors CS1/CS2 in exemplary pixel circuits 300A, 300B and 300C of the present disclosure, meeting more than one of the aforementioned requirements can be a difficult task with the display device 100 employing a single type of TFTs.

For example, some might expect that a display device employing oxide TFTs exclusively would provide the minimal leakage current in the pixel circuits of FIG. 3A through FIG. 3C. However, permanent shift of the threshold voltage Vth often occurs in oxide TFTs by the bias stress caused by continuous flow of current for an extended period of time. In the operation of exemplary 4T2C pixel circuits described above, the third switching TFT S3 operating based on the emission signal EM, is in "On" state much longer than other TFTs of the pixel circuit. Under such operation condition, the stability of the third switching TFT S3 can deteriorate in no time.

Therefore, a pixel circuit can be implemented with a combination of LTPS TFTs and oxide TFTs.

Reduction of Size of Circuit Part by Overlapping Gate Lines

Figure 5A:
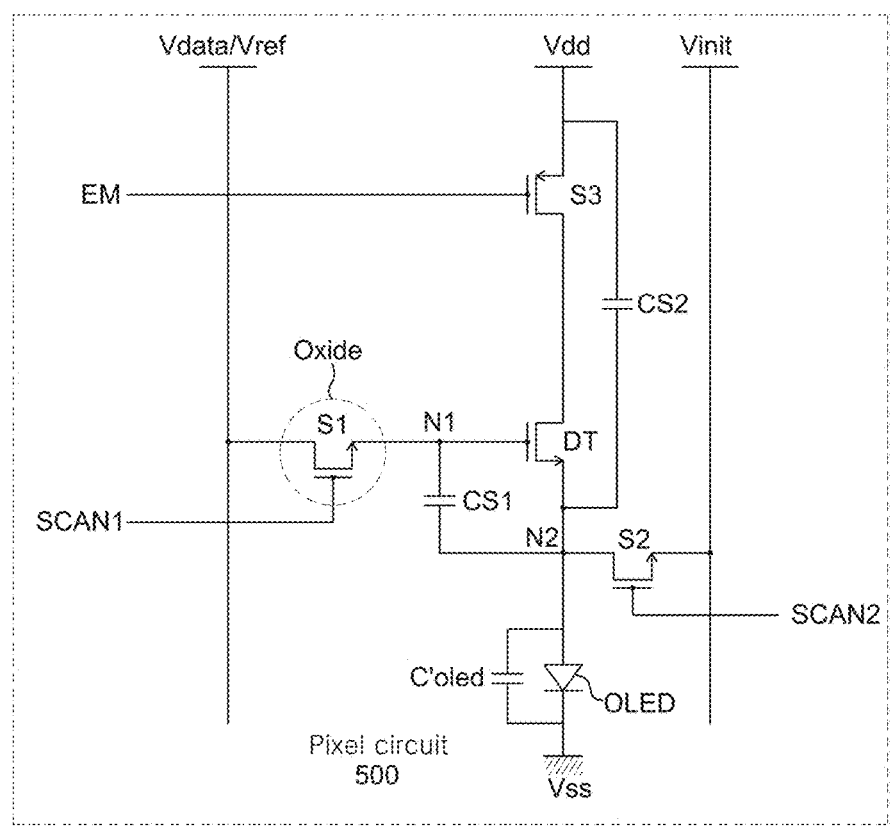
FIG. 5A is a schematic diagram of an exemplary display device employing two different types of TFTs in a single pixel circuit according to an embodiment of the present disclosure.
Figure 5B:
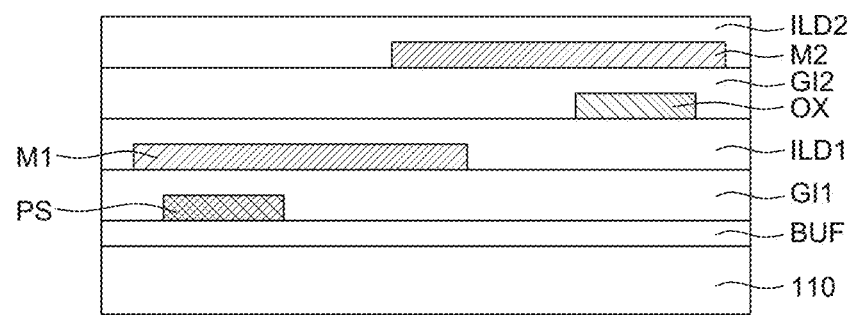
FIG. 5B is a schematic cross-sectional view of a gate line connected to the two different types of TFTs depicted in FIG. 5A.

FIG. 5A is a schematic diagram of an exemplary display device employing two different types of TFTs in a single pixel circuit according to an embodiment of the present disclosure. FIG. 5B is a schematic cross-sectional view of a gate line connected to the two different types of TFTs depicted in FIG. 5A. A pixel circuit 500 depicted in FIG. 5A is an exemplary pixel circuit which can be applied to the display device 100 depicted in FIG. 1.

Referring to FIG. 5A, in the pixel circuit 500, various other combinations of LTPS TFTs and oxide TFTs can be made. To be specific, LTPS TFTs are basically used as the TFTs S2, S3 and DT of the pixel circuit 500. An oxide TFT having an excellent voltage holding ratio may be used as the first switching TFT S1 as a switching TFT required to have a holding characteristic. One terminal of the first switching TFT S1 as an oxide TFT is connected to a gate electrode of the driving TFT DT. Accordingly, the first switching TFT S1 can minimize the leakage current in the pixel circuit 500 due to an excellent off-current characteristic of the oxide TFT. Thus, when the pixel circuit 500 operates, the efficiency of the data voltage Vdata is improved.

As such, if different types of TFTs including the LTPS TFTs and oxide TFTs are used in the pixel circuit 500, the gate lines GL may be overlapped in order to reduce an area occupied by the gate lines GL connected to the respective TFTs.

Referring to FIG. 5B for more detailed explanation, a buffer layer BUF for suppressing moisture penetration from the outside is disposed on the substrate 110. A poly-Si layer PS is disposed on the buffer layer BUF. A first metal layer M1 is disposed on the poly-Si layer PS. A first gate insulation layer GI1 for insulating the poly-Si layer PS and the first metal layer M1 is disposed between the poly-Si layer PS and the first metal layer M1. The poly-Si layer PS is an active layer of the second switching TFT S2 as an LTPS TFT. The first metal layer M1 is a gate line GL connected to the second switching TFT S2 and transferring a second scan signal SCAN2. A metal oxide layer OX is disposed on the first metal layer M1. A first interlayer insulation layer ILD1 is disposed between the first metal layer M1 and the metal oxide layer OX. A second metal layer M2 is disposed on the metal oxide layer OX. A second gate insulation layer GI2 for insulating the metal oxide layer OX and the second metal layer M2 is disposed between the metal oxide layer OX and the second metal layer M2. A second interlayer insulation layer ILD2 is disposed on the second metal layer M2. The metal oxide layer OX is an active layer of the first switching TFT S1 as an oxide TFT. The second metal layer M2 is a gate line GL connected to the first switching TFT S1 and transferring a first scan signal SCAN1.

Since a plurality of TFTs is used in the pixel circuit 500, a plurality of gate lines GL connected to the respective TFTs is disposed on the substrate 110. The plurality of gate lines GL is extended from the gate driver GD and thus extended in the same direction on the substrate 110. Thus, if the plurality of gate lines GL occupies a separate space on the substrate 110, as the number of the gate lines GL increases, a space occupied by the pixel circuit 500 on the substrate 110 also increases. Particularly, if the plurality of gate lines GL is disposed on the same plane, it is impossible to reduce the space occupied by the gate lines GL. As such, if the space of the pixel circuit 500 is increased, the size of an emission area in the display device 100 is reduced, which makes it difficult to implement a display device with high resolution. Further, if the display device 100 is a transparent display device, a size of a light transmissive area is also reduced.

In one embodiment, the plurality of gate lines GL is overlapped with each other. Referring to FIG. 5B, the first metal layer M1 is a gate line GL connected to the second switching TFT S2, and the second metal layer M2 is a gate line connected to the first switching TFT S1. Further, the first metal layer M1 and the second metal layer M2 are disposed so as to be overlapped with each other. Accordingly, the area occupied by the plurality of gate lines GL in the pixel circuit 500 is reduced, and, thus, an aperture ratio of the display device 100 may be increased. Therefore, it is possible to implement a display device with high resolution. Further, if the display device 100 is a transparent display device, a size of a light transmissive area may be increased. Therefore, an aperture ratio of the transparent display device may be increased.

Meanwhile, in some embodiments, the second switching TFT S2 may also be an oxide TFT. The first switching TFT S1 and the second switching TFT S2 that are connected to capacitors (CS1 and CS2) can minimize the leakage current in the pixel circuit 500 due to excellent off-current characteristics of an oxide TFTs. Thus, when the pixel circuit 500 operates, the efficiency of the data voltage Vdata can be improved. In this case, the gate line GL connected to the third switching TFT S3 as an LTPS TFT may be overlapped with the gate line GL connected to the first switching TFT S1 or the gate line GL connected to the second switching TFT S2. That is, the gate line GL that transfers an emission signal EM to the third switching TFT S3 is disposed to be overlapped with the gate line GL of the first switching TFT S1 or second switching TFT S2 as an oxide TFT. Thus, the area occupied by the pixel circuit 500 can be reduced.

Figure 6A:
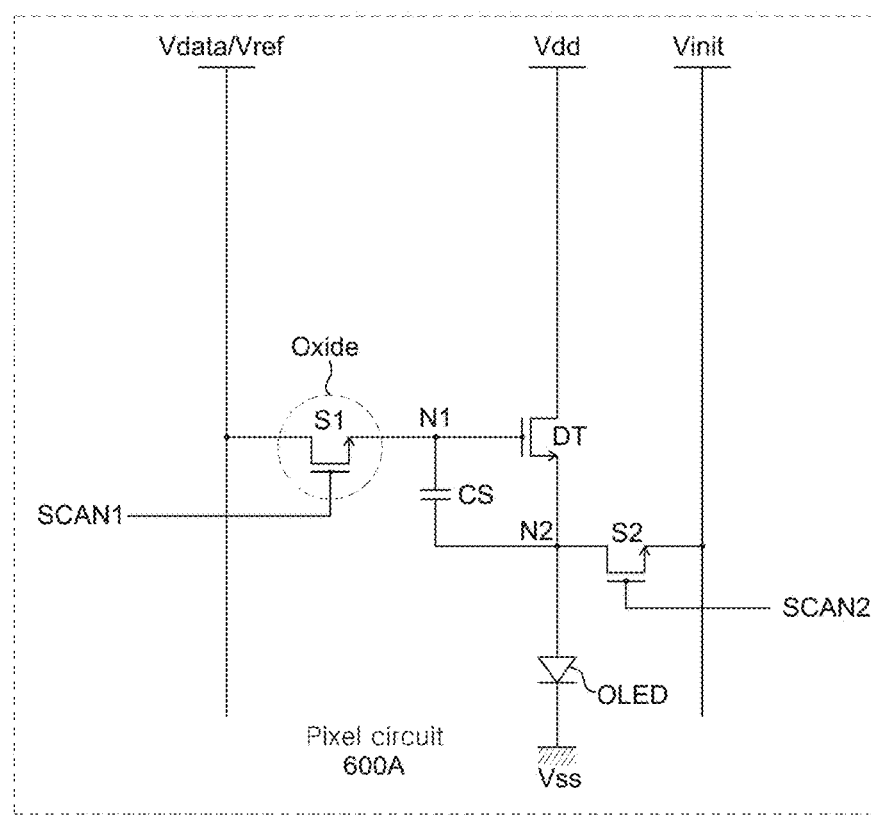
FIG. 6A and FIG. 6B are schematic views of an exemplary display device employing two different types of TFTs in a single pixel circuit according to various embodiments of the present disclosure.
Figure 6B:
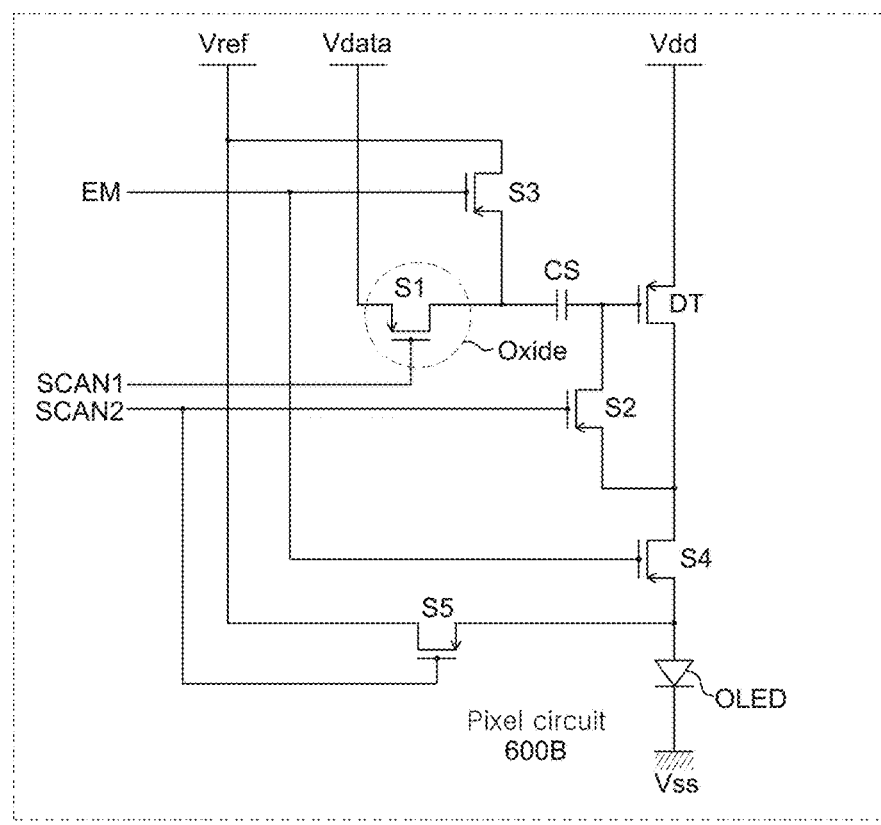

FIG. 6A and FIG. 6B are schematic views of an exemplary display device employing two different types of TFTs in a single pixel circuit according to various embodiments of the present disclosure. Pixel circuits 600A and 600B illustrated in FIG. 6A and FIG. 6B, respectively, are exemplary pixel circuits which can be applied to the display device 100 illustrated in FIG. 1.

Referring to FIG. 6A, each pixel of the display device 100 includes an OLED, and each pixel circuit 600A including a driving TFT DT, first and second switching TFTs S1 and S2, and a capacitor CS. This alignment may be referred in the present disclosure as a 3T1C pixel circuit.

Among the two switching TFTs S1 and S2 connected to two different gate lines GL in the pixel circuit 600A, the first switching TFT S1 connected to a gate electrode of the driving TFT DT may be implemented with an oxide TFT. That is, an oxide TFT having an excellent voltage holding ratio may be used as the first switching TFT S1 as a switching TFT required to have a holding characteristic. Further, the pixel circuit 600A is configured such that the second metal layer M2 illustrated in FIG. 5B becomes a gate line GL connected to the first switching TFT S1 and transferring the first scan signal SCAN1. Furthermore, the pixel circuit 600A is configured such that the first metal layer M1 illustrated in FIG. 5B becomes a gate line GL connected to the second switching TFT S2 and transferring the second scan signal SCAN2. Thus, the area occupied by the plurality of gate lines GL can be reduced.

Further, referring to FIG. 6B, each pixel of the display device 100 includes an OLED, and each pixel circuit 600B including a driving TFT DT, first to five switching TFTs S1-S5, and a capacitor CS. This alignment may be referred in the present disclosure as a 6T1C pixel circuit.

Among the five switching TFTs S1-S5 connected to different gate lines GL in the pixel circuit 600B, the first switching TFT S1 connected to a gate electrode of the driving TFT DT may be implemented with an oxide TFT. That is, an oxide TFT having an excellent voltage holding ratio may be used as the first switching TFT S1 as a switching TFT required to have a holding characteristic. Further, a gate line GL connected to the first switching TFT S1 and transferring the first scan signal SCAN1 is disposed as the second metal layer M2 illustrated in FIG. 5B. Furthermore, a gate line GL connected to the fourth switching TFT S4 and transferring the second scan signal SCAN2 is disposed as the first metal layer M1 illustrated in FIG. 5B. Thus, the area occupied by the plurality of gate lines GL can be reduced.

Further, the above-described technology can also be applied to various pixel circuits which are not illustrated in the drawings. In other words, if a plurality of switching TFTs is disposed and two or more gate lines GL extended in the same direction are disposed in a pixel circuit, one of the plurality of switching TFTs may be implemented with an oxide TFT. Another one of the plurality of switching TFTs may be implemented with an LTPS TFT. The gate lines GL respectively connected to the TFTs may be disposed so as to be overlapped with each other. That is, the number of TFTs and the number of capacitors included in a pixel circuit are not limited to the embodiments described in the present disclosure.

In addition, the above-described technology can also be applied to a driving circuit disposed in the non-display area of the substrate 110. For example, as illustrated in FIG. 1 and FIG. 2, in the non-display area of the substrate 110, the gate driver GD may be disposed as a driving circuit for supplying one or more gate signals to the pixel. The gate driver GD may be implemented with a plurality of TFTs. Accordingly, one of the plurality of switching TFTs of the gate driver GD may be implemented with an oxide TFT and another one may be implemented with an LTPS TFT. Further, the gate lines GL respectively connected to the TFTs may be disposed so as to be overlapped with each other. Since the gate lines GL in the non-display area of the substrate 110 are disposed so as to be overlapped with each other, the area occupied by the driving circuit in the non-display area is reduced. Thus, a size of a part of the display device 100 that needs to be covered by a bezel can be reduced.

Figure 7:
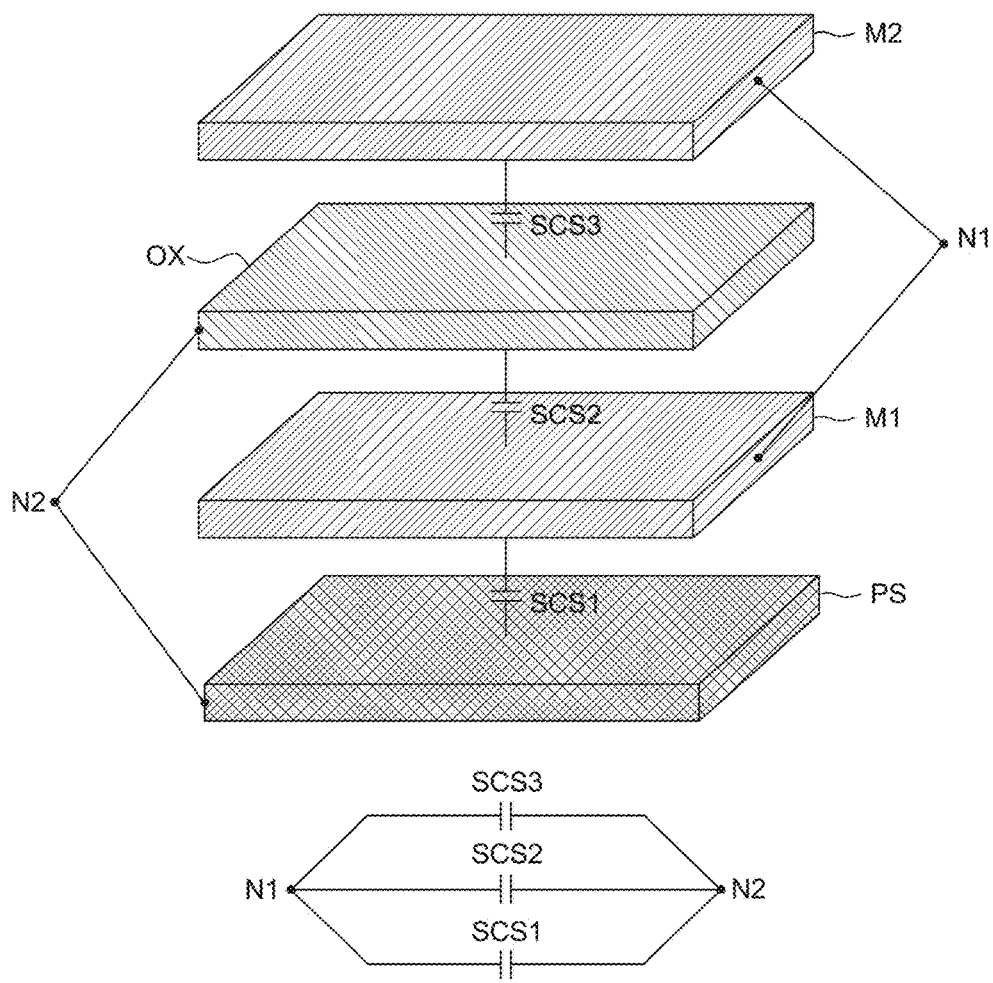
FIG. 7 is a schematic diagram of an exemplary display device employing a plurality of capacitors connected in parallel to each other in a pixel circuit according to an embodiment of the present disclosure.

High-Capacitance Capacitor Using a Plurality of Capacitors Connected in Parallel FIG. 7 is a schematic diagram of an exemplary display device employing a plurality of capacitors connected in parallel to each other in a pixel circuit according to an embodiment of the present disclosure. FIG. 7 provides a schematic exploded perspective view of a first capacitor CS1 between the first node N1 and the second node N2 in the pixel circuit 500 illustrated in FIG. 5A.

Referring to FIG. 7, the first metal layer M1 is disposed on the poly-Si layer PS. The metal oxide layer OX is disposed on the first metal layer M1. The second metal layer M2 is disposed on the metal oxide layer OX. The poly-Si layer PS is formed of conductivized polycrystalline silicon and the metal oxide layer OX is formed of conductivized metal oxide. The second metal layer M2 is formed of the same material as the gate electrode of the first switching TFT S1 which is an oxide TFT. The first metal layer M1 is formed of the same material as the gate electrode of the second switching TFT S2 which is an LTPS TFT. Further, the poly-Si layer PS, the second metal layer M2, the metal oxide layer OX, and the first metal layer M1 are overlapped with each other. Accordingly, as illustrated in FIG. 7, there is formed a structure in which the four conductive layers are overlapped with each other.

The first node N1 is connected to the first metal layer M1 and the second metal layer M2. The second node N2 is connected to the metal oxide layer OX and the poly-Si layer PS. Therefore, between the first node N1 and the second node N2, a first sub-capacitor SCS1, a second sub-capacitor SCS2, and a third sub-capacitor SCS3 are implemented. The first sub-capacitor SCS1 has the poly-Si layer PS and the first metal layer M1 as its two terminals. The second sub-capacitor SCS2 has the first metal layer M1 and the metal oxide layer OX as its two terminals. The third sub-capacitor SCS3 has the metal oxide layer OX and the second metal layer M2 as its two terminals. Further, according to the connection between the nodes N1 and N2, the first sub-capacitor SCS1, the second sub-capacitor SCS2, and the third sub-capacitor SCS3 are connected in parallel to each other between the first node N1 and the second node N2.

Therefore, in one embodiment, the first capacitor CS1 is formed into a structure in which a plurality of sub-capacitors SCS1, SCS2, and SCS3 are connected in parallel to each other. Accordingly, the first capacitor CS1 can be implemented as a capacitor having a high capacitance in a limited area. Further, in the display device 100 according to an embodiment, an area required to implement the first capacitor CS1 having the same capacitance as the case of using a single capacitor may be reduced. Accordingly, an area occupied by the first capacitor CS1 in the pixel circuit 500 is reduced, and, thus, an aperture ratio of the display device 100 may be increased. Therefore, it is possible to implement a display device with high resolution. Further, if the display device 100 is a transparent display device, a size of a light transmissive area may be increased. Therefore, an aperture ratio of the transparent display device may be increased.

The structure including a plurality of capacitors connected in parallel to each other may be applied to the pixel circuits 600A and 600B respectively illustrated in FIG. 6A and FIG. 6B. To be specific, the capacitor CS between the first node N1 and the second node N2 illustrated in FIG. 6A may be formed into the structure including a plurality of capacitors connected in parallel to each other. Further, the capacitor CS between the first node N1 and the second node N2 illustrated in FIG. 6B may be formed into the structure including a plurality of capacitors connected in parallel to each other.

In addition, the above-described technology can be applied to the driving circuit disposed in the non-display area of the substrate 110. For example, as illustrated in FIG. 1 and FIG. 2, in the non-display area of the substrate 110, the gate driver GD may be disposed as a driving circuit for supplying one or more gate signals to the pixel. The gate driver GD may be implemented with a plurality of TFTs and one or more capacitors CS. Therefore, the capacitor CS of the gate driver GD may be formed into the structure including a plurality of sub-capacitors CS connected in parallel to each other. Thus, the area occupied by the capacitor CS in the non-display area may be reduced. Therefore, a size of a part of the display device 100 that needs to be covered by a bezel can be reduced.

Adjustable Refresh Rate Driving Method

As briefly discussed above, it may be desirable to adjust frame rate of a display device based on the image content. Lowering the frame rate for at least some part of the display device can result in extra power savings, which is one of the most critical issues for mobile devices. Combined use of oxide TFTs and LTPS TFTs in a display device can facilitate adjustment of a frame rate in such a display device.

Figure 8:
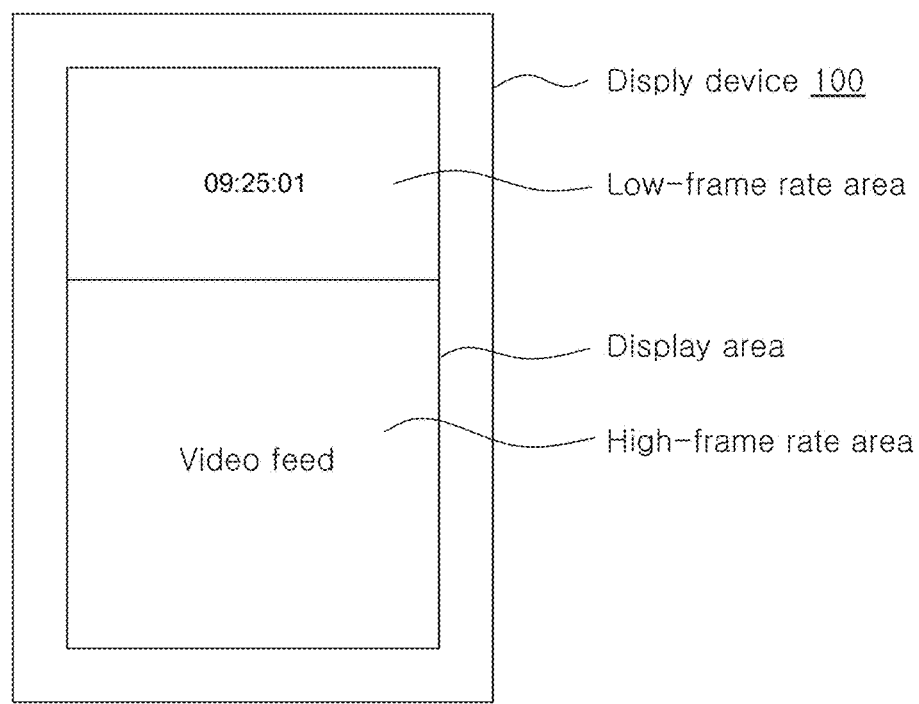
FIG. 8 is a diagram illustrating an exemplary display mode of a display device according to an embodiment of the present disclosure.

FIG. 8 is a diagram illustrating an exemplary display mode of a display device according to an embodiment of the present disclosure. FIG. 8 illustrates an exemplary screen which can be presented by the display device 100, in which a part of the display area is driven with lower frame rate.

In this example, the display area is divided into two or more parts. To be specific, the display area may be divided into two parts: the low frame rate part displaying relatively slow changing image content (for example, current time); and the fast frame rate part displaying relatively fast changing image content (for example, movie). In this example, the low frame rate part of the display area, which presents the current time to the seconds, may only need to be refreshed at one frame per second (1 frame/s).

In a conventional display, however, the driving circuits would output signals (for example, scan signal, data voltage, emission signal, and the like) sequentially to the pixel circuits in the display area at a predetermined frequency. Thus, the entire display device operates at a fixed frame rate (for example, 60, 120, 240 Hz, and the like). In a display device operating at 60 frames per second, signals supplied to the pixel circuits in the low frame rate part of the display area for 59 frames may be viewed as waste of power, at least in theory.

Data Driver Operation Under LRR

Accordingly, in some embodiments, the frequency of signals to the pixel circuits provided from at least one of the driving circuits is controlled depending on the image content to be presented on the display device 100. This can be achieved by adding switching circuits to the gate driver GD, to the data driver DD, or to both the gate driver GD and the data driver DD, which is controllable by the low refresh rate signal LRR.

In one embodiment, the data driver DD is configured to receive the low refresh rate signal LRR from the timing controller TC, and to control the refresh rate of an image content. For example, when the image content is a fast changing image content (for example, video), the timing controller TC provides the low refresh rate signal LRR in a predetermined level (for example, low state) to the data driver DD. Thus, the data driver DD processes image data at a preset normal refresh rate. This means that data voltage Vdata is output at a normal refresh rate. In another words, image data for each frame is processed every frame period. In this regard, the data driver DD maintains buffers installed therein in an on state when the data driver DD operates in a normal refresh mode.

On the other hand, the timing controller TC provides the low refresh rate signal LRR of a predetermined state (for example, high state) to the data driver DD when the image data is a still content (or slow changing image content). In this case, the data driver DD processes the image data at a lower refresh rate than the normal refresh rate. In the low speed refresh mode, image data of one frame is processed for a predetermined frame period only, such that the data voltages Vdata are output at a low refresh rate. To this end, the data driver DD may maintain buffers installed therein in "On" state for the specific frame period only, and maintains the buffers in "Off" state for the remaining frame periods. By turning off the buffers in the data driver DD, the pixel circuits are updated with new data voltages Vdata only every specific frame period, which can reduce the power consumption of the display device 100.

Figure 9:
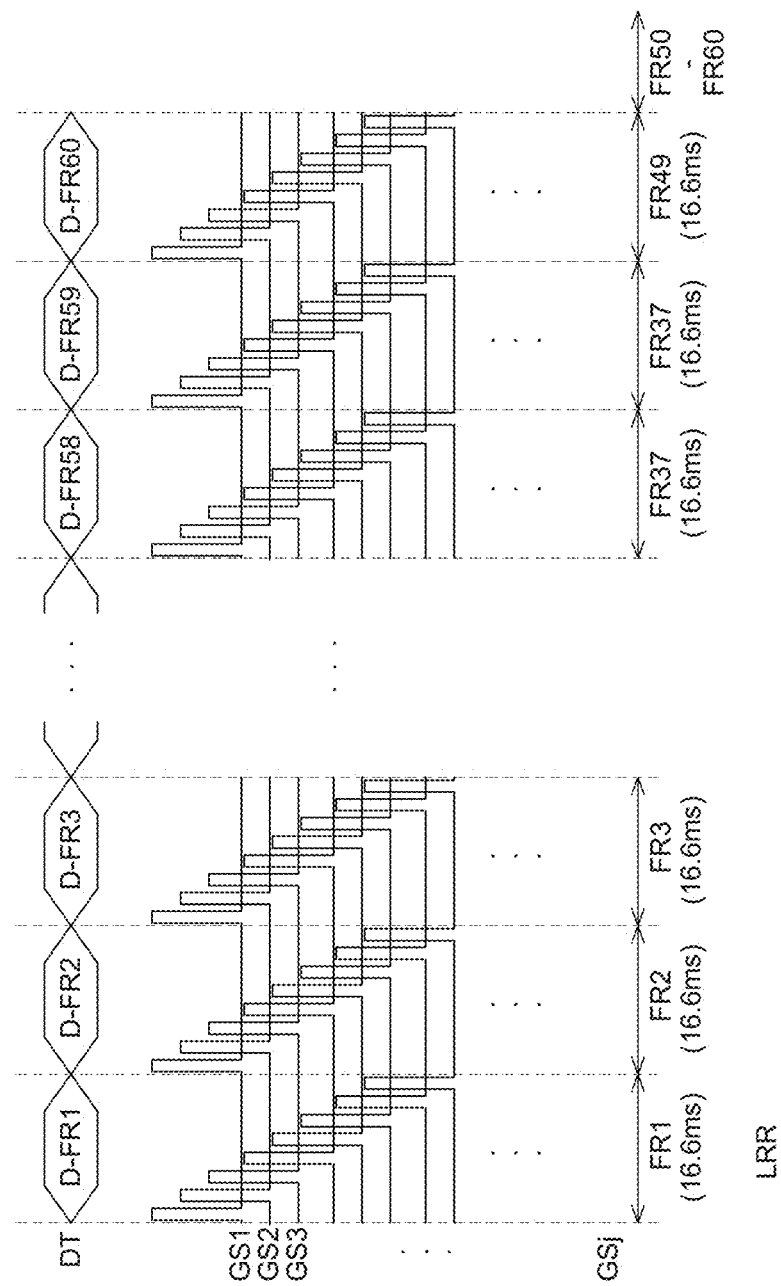
FIG. 9 is a timing diagram illustrating an exemplary operation of a display device according to an embodiment of the present disclosure in a normal refresh mode.

FIG. 9 is a timing diagram illustrating an exemplary operation of a display device according to an embodiment of the present disclosure in a normal refresh mode. FIG. 9 is a timing diagram illustrating an exemplary operation of the timing controller TC, the gate driver GD, and the data driver DD in a normal refresh mode. In a normal refresh mode, the low refresh rate signal LRR from the timing controller TC is maintained in a low state so that the switching circuits coupled to the data driver DD are turned on. The gate signals GS1 through GSj are sequentially output by the gate driver GD every frame period and the image data of every frame period FR1 through FR60 is processed by the data driver DD. Assuming that a length of one frame is 16.6 ms, approximately 60 sheets of frames are processed per second, as seen from FIG. 11. That is, the data driver DD performs a refresh operation at 60 Hz.

Figure 10:
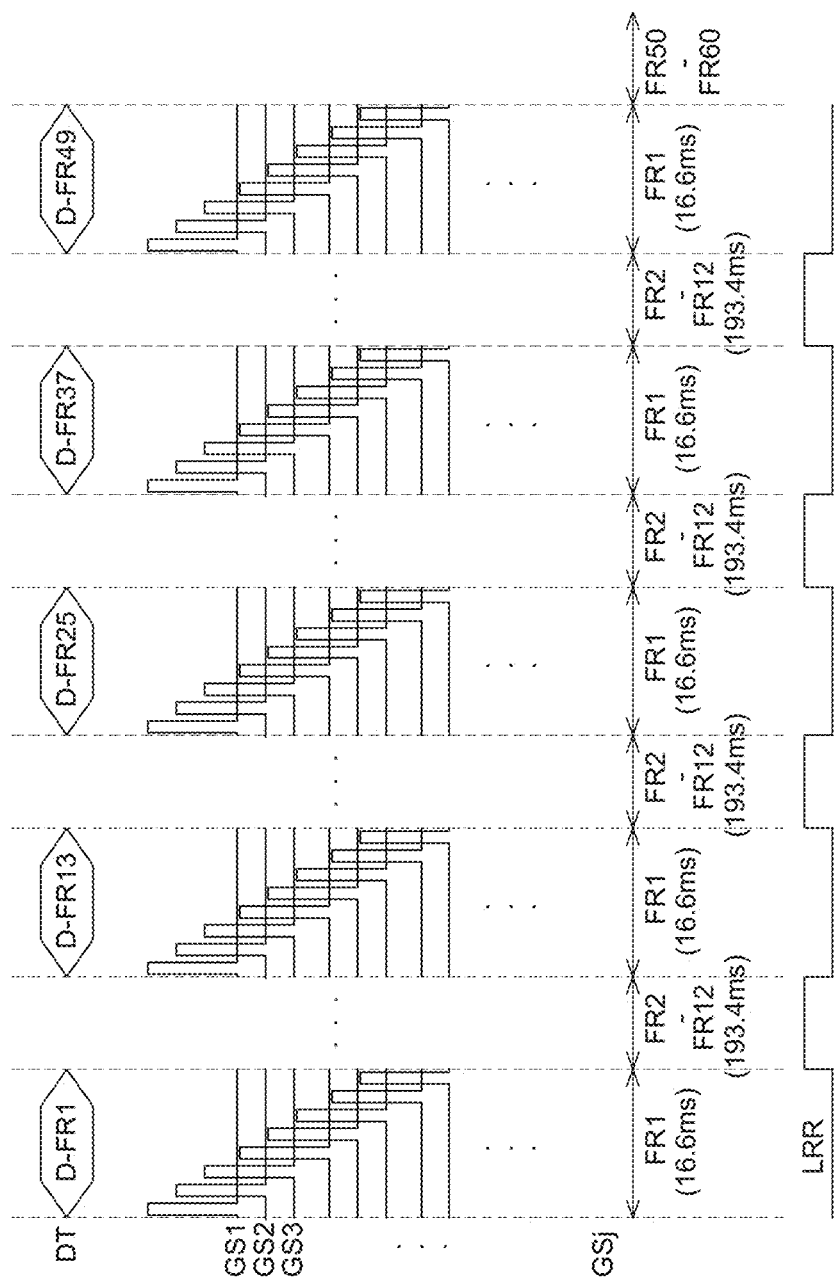
FIG. 10 is a timing diagram illustrating an exemplary operation of a display device according to an embodiment of the present disclosure in a low speed refresh mode.

FIG. 10 is a timing diagram illustrating an exemplary operation of a display device according to an embodiment of the present disclosure in a low speed refresh mode. FIG. 10 is a view explaining the operations of the timing controller TC, the gate driver GD, and the data driver DD in a low speed refresh mode. In the low speed refresh mode, the low refresh rate signal LRR from the timing controller TC is maintained in a low state for specific frame periods FR1, FR13, FR25, FR37, and FR49, and is maintained in a high state for remaining periods FR2-FR12, FR14-FR24, FR26-FR36, FR38-FR48 and FR50-FR60. Accordingly, the switching circuits coupled to the data driver DD are turned off by the low refresh rate signal LRR for 2nd through 12th frame periods FR2 through FR12, 14th through 24th frame periods FR14 through FR24, 26th through 36th frame periods FR26 through FR36, 38th through 48th frame periods FR38 through FR48, and 50th through 60th frame periods FR50 through FR60.

Even if the gate signals GS1 through GSj are sequentially output by the gate driver every frame period, only the image data in image frames D-FR1, D-FR13, D-FR25, D-FR37 and D-FR49 are processed during the corresponding frame periods FR1, FR13, FR25, FR37, and FR49 among the 60 frame periods. Assuming that a length of one frame is 16.6 ms, approximately 5 sheets of frames are processed per second, as seen from FIG. 10. That is, the data driver DD performs a refresh operation at 5 Hz.

Referring to FIG. 10, remaining frame periods between two specific adjacent frame periods are set such that time (for example, 183.4 ms) corresponding to the remaining frame periods between the two specific adjacent frame periods (for example, FR2 through FR12) is greater than time (for example, 16.6 ms) corresponding to one specific frame period (for example, FR1) of the two specific adjacent frame periods.

In some embodiments, the low refresh rate signal LRR can be provided to the switching circuits coupled to the data driver DD during a single frame period so that only a part of the display device 100 is updated with the new data voltage Vdata. For example, the low refresh rate signal LRR may be provided to the switching circuits coupled to the data driver DD during the period of a frame in which the gate driver DD outputs scan signals on certain gate lines. For instance, the low refresh rate signal LRR can be provided to the switching circuits coupled to the data driver DD when the gate lines GL10 through GL100 outputs scan signal in selected frames. The pixel circuits connected to the gate lines GL10 through GL100 will not be provided with the new data voltage Vdata from the data driver DD for those selected frames. In this setting, a part of the display area (for example, pixels connected to the gate lines GL10 through GL100) can be updated at a frequency different from the remaining part of the display area.

Figure 11:
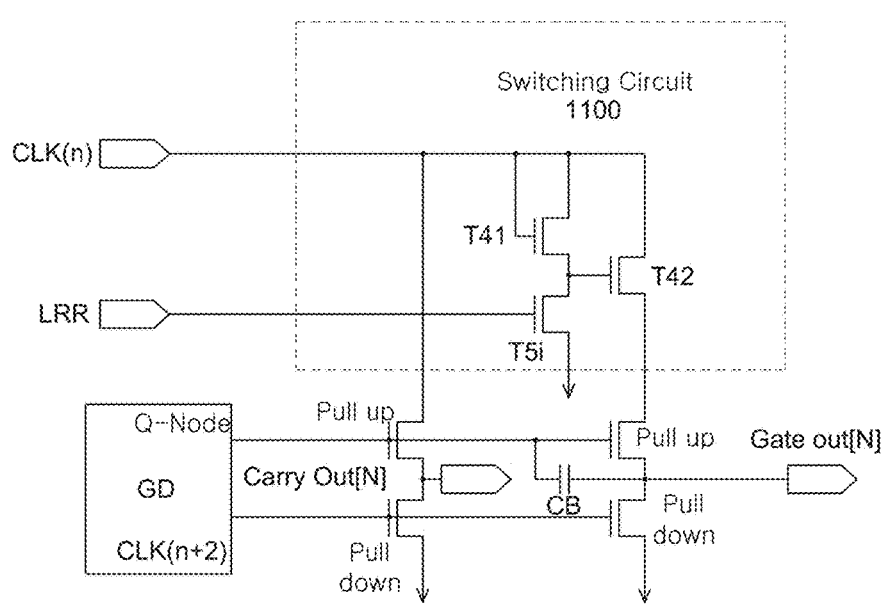
FIG. 11 is a schematic circuit diagram illustrating an exemplary inverter circuit of a display device according to an embodiment of the present disclosure.

While running only a part of the display area under the low refresh mode can be done by controlling the switching circuits on the data driver side, it may result in heavy load on the timing controller TC. As such, in one embodiment, the low refresh rate signal LRR is provided to the switching circuits coupled to the gate driver GD. More specifically, the gate driver GD includes a plurality of stages forming a shift register, and a switching circuit 1100 can be coupled to each of the stages or some of the stages as illustrated in FIG. 11.

The switching circuit 1100 is implemented with one or more of TFTs, in which at least one of the TFTs is configured to receive LRR signal for controlling output of a gate signal to the corresponding pixel circuit. When the low refresh rate signal LRR is low, the gate driver GD operates at a preset normal refresh rate. That is, the switching circuits allow the gate signals from the gate driver GD to be provided on all of the gate lines [N] in sequence for each of the frames. When the low refresh rate signal LRR is high, however, the frequency of the gate signals from the gate driver GD on some or all of the gate lines can be limited.

For operating the entire display area under the low refresh rate mode, the frequency of the gate start pulse signal and/or gate shift clock GSC can be adjusted to reduce the frequency of the pixel circuits to be updated with new data voltage Vdata. To this end, a switch circuit controllable by the low refresh rate LRR signal can be used to hold off the gate start pulse signal for certain frames. Similarly, a switching circuit controllable by the low refresh rate LRR signal can be used to hold off the gate shift clock GSC to create a delay between activation of each shift register. Also, a switching circuit can be configured to control the gate output enable signal GOE for each of the stages based on the low refresh rate LRR signal. For instance, when the low refresh rate signal LRR is high, the gate output enable signal GOE can be set so that the pixels are not loaded with the data voltage Vdata.

Regardless of how the switching circuit 1100 is used to implement the low refresh rate mode, the pixel circuits operating under the low refresh rate mode are not loaded with the new data voltage Vdata for one or more frames. The pixels which are not loaded with the data voltage Vdata emit luminance based on the data voltage Vdata that was loaded in the prior frame supplied with the data voltage Vdata.

However, operating the display with the low refresh rate mode described above may not be feasible with a display device employing a single type of TFTs. For instance, the driving TFT DT within the pixel circuit must maintain the stable driving voltage during the period in which the data is not processed by the data driver DD. Also, the driving voltage may be reduced by a parasitic capacitance while the switching transistor is turned off.

As described above, an oxide semiconductor has an excellent voltage holding ratio. However, sensing of the Vth can take significantly longer with an oxide TFT (for example, as much as 7 times of an LTPS TFT). Also, using oxide TFTs to implement the driving circuit in the non-display area may increase the bezel size. As such, implementing the driving circuit entirely by using the oxide TFT may not provide sufficient driving frequency during the normal refresh mode of the display device 100. However, driving the display device with the adjustable refresh rate as described in the present disclosure can be realized by using a display device implemented with various types of a combination of oxide TFTs and LTPS TFTs.

In an embodiment, TFTs connected to the storage capacitor include oxide semiconductor to minimize the leakage current from the capacitor while using an LTPS TFT for the driving TFT DT. For instance, the first switching TFT S1 and the second switching TFT S2 can be formed with an LTPS TFT to minimize the leakage current from the storage capacitors C1 and C2. Further, TFTs in the pixel circuit and/or the driving circuit turned on for an extended period of time for operating the display device 100 by adjusting the refresh rate can be formed with LTPS TFTs. For example, the third switching transistor S3 that is controlled by the emission signal EM can be formed with an LTPS TFT. Also, LTPS TFT can be used for the TFT that implements the switching circuits coupled to the gate driver GD and/or the data driver DD. In particular, the TFT that is applied with the high state refresh rate signal LRR can be formed with an LTPS TFT (for example, TFT T5*i* in the switching circuit 1100).

While the present disclosure has been particularly illustrated and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims. The low refresh rate driving mode and the display device suitable for such a driving mode have been described in the context of OLED device. However, it should be appreciated that the similar display device of the embodiments disclosed in the present disclosure can be used for a liquid crystal display (LCD) device to implement the low refresh rate mode.

The invention claimed is:

1. A display device comprising:
   a substrate;
   a polycrystalline silicon (poly-Si) layer on the substrate;
   a first metal layer on the poly-Si layer;
   a metal oxide layer on the first metal layer;
   a second metal layer disposed on the metal oxide layer and overlapped with the first metal layer;
   a capacitor in which a first sub-capacitor, a second sub-capacitor, and third sub-capacitor are connected in parallel to each other, two terminals of the first sub-capacitor are the poly-Si layer and the first metal layer, two terminals of the second sub-capacitor are the first metal layer and the metal oxide layer, and two terminals of the third sub-capacitor are the metal oxide layer and the second metal layer; and
   a first thin-film-transistor (TFT) and a second TFT are disposed in a pixel defined on the substrate,
   wherein the poly-Si layer is an active layer of the first TFT, and the metal oxide layer is an active layer of the second TFT connected to the second metal layer, and
   wherein the capacitor is provided in the pixel defined on the substrate.

2. The display device according to claim 1, further comprising:
   a plurality of switching thin-film-transistors (TFTs) and a driving TFT disposed in the pixel defined on the substrate,
   wherein the first metal layer and the second metal layer are respectively connected to gate electrodes of different switching TFTs among the plurality of switching TFTs.

3. The display device according to claim 2, wherein the first metal layer and the second metal layer are extended in the same direction.

4. The display device according to claim 2, wherein the first metal layer and the second metal layer are gate lines.

5. The display device according to claim 2, wherein one terminal of a switching TFT connected to the second metal layer is connected to a gate electrode of the driving TFT.

6. The display device according to claim 1, further comprising:
a driving circuit disposed in a non-display area of the substrate and implemented with a plurality of TFTs,
wherein the first metal layer and the second metal layer are respectively connected to gate electrodes of different TFTs among the plurality of TFTs.

7. The display device according to claim 6, wherein the driving circuit is a gate driver for providing one or more gate signals to the pixel defined on the substrate.

8. The display device according to claim 1, wherein the poly-Si layer includes conductivized polycrystalline silicon,
the metal oxide layer includes conductivized metal oxide, and
the poly-Si layer, the first metal layer, the metal oxide layer and the second metal layer are overlapped with each other.

9. The display device according to claim 1, further comprising:
the first TFT is a first switching TFT having one terminal connected to a first node;
a driving TFT having a gate electrode connected to the first node and one terminal connected to a second node;
the second TFT is a second switching TFT having one terminal connected to the second node; and
an organic light emitting diode connected to the second node, wherein the capacitor is connected between the first node and the second node.

10. The display device according to claim 9, wherein the first metal layer includes the same material as a gate electrode of the second switching TFT, and
the second metal layer includes the same material as a gate electrode of the first switching TFT.

11. The display device according to claim 9, wherein the second switching TFT is an oxide TFT, and the first switching TFT and the driving TFT are low-temperature polycrystalline silicon (LTPS) TFTs.

12. The display device according to claim 9, wherein the first metal layer and the second metal layer are connected to the first node, and
the poly-Si layer and the metal oxide layer are connected to the second node.

13. The display device according to claim 1, further comprising: a driving circuit disposed on a non-display area of the substrate and including the capacitor.

14. The display device according to claim 13, wherein the driving circuit is a gate driver for providing one or more gate signals to the pixel defined on the substrate.

* * * * *